United States Patent
Kamiya et al.

(10) Patent No.: US 10,354,859 B1
(45) Date of Patent: Jul. 16, 2019

(54) THREE-DIMENSIONAL RESISTIVE RANDOM ACCESS MEMORY DEVICE CONTAINING SELECTIVELY GROWN AMORPHOUS SILICON-CONTAINING BARRIER AND METHOD OF MAKING THE SAME

(71) Applicant: SANDISK TECHNOLOGIES LLC, Plano, TX (US)

(72) Inventors: Hiroyuki Kamiya, Yokkaichi (JP); Shigehisa Inoue, Yokkaichi (JP); Seiji Shimabukuro, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/920,793

(22) Filed: Mar. 14, 2018

(51) Int. Cl.
*H01L 21/02* (2006.01)
*H01L 27/24* (2006.01)
(Continued)

(52) U.S. Cl.
CPC .... *H01L 21/02211* (2013.01); *G11C 13/0007* (2013.01); *H01L 21/02107* (2013.01); *H01L 21/02126* (2013.01); *H01L 21/02164* (2013.01); *H01L 21/02214* (2013.01); *H01L 21/8221* (2013.01); *H01L 21/8229* (2013.01); *H01L 21/8232* (2013.01); *H01L 21/823487* (2013.01);
(Continued)

(58) Field of Classification Search
CPC ......... H01L 21/02107; H01L 21/02126; H01L 21/02164; H01L 21/02211; H01L 21/0221; H01L 21/8221; H01L 21/8229; H01L 21/8232; H01L 21/823487; H01L 21/823885
See application file for complete search history.

(56) References Cited

U.S. PATENT DOCUMENTS 9,553,100 B2  1/2017 Kamiya et al.
9,754,665 B2  9/2017 Chen et al.
(Continued)

FOREIGN PATENT DOCUMENTS

WO   WO 2007/004843 A1   1/2007

OTHER PUBLICATIONS

U.S. Appl. No. 15/400,244, filed Jan. 6, 2017, SanDisk Technologies Inc.
(Continued)

*Primary Examiner* — Eduardo A Rodela
(74) *Attorney, Agent, or Firm* — The Marbury Law Group, PLLC

(57) ABSTRACT

An alternating stack of insulating layers including a silicon oxide material and electrically conductive layers is formed over a substrate. Sidewalls of the insulating layers are selectively silylated with a chemical including at least one silyl group without silylating sidewalls of the electrically conductive layers. Silicon-containing barrier material portions are formed by selectively growing a first silicon-containing barrier material from surfaces of the electrically conductive layers without growing the first silicon-containing barrier material from silylated surfaces of the insulating layers. A memory material layer is formed on the silicon-containing barrier material portions and the sidewalls of the insulating layers. A vertical conductive line is formed on the memory material layer.

10 Claims, 26 Drawing Sheets

(51) Int. Cl.
*H01L 45/00* (2006.01)
*G11C 13/00* (2006.01)
*H01L 21/8229* (2006.01)
*H01L 21/8238* (2006.01)
*H01L 21/8234* (2006.01)
*H01L 21/822* (2006.01)
*H01L 21/8232* (2006.01)

(52) U.S. Cl.
CPC .... *H01L 21/823885* (2013.01); *H01L 27/249* (2013.01); *H01L 45/08* (2013.01); *H01L 45/124* (2013.01); *H01L 45/1253* (2013.01); *H01L 45/146* (2013.01); *H01L 45/1683* (2013.01); *G11C 2213/32* (2013.01); *G11C 2213/51* (2013.01); *G11C 2213/52* (2013.01); *G11C 2213/71* (2013.01); *G11C 2213/79* (2013.01); *H01L 27/2454* (2013.01)

(56) References Cited

U.S. PATENT DOCUMENTS

| | | | |
|---|---|---|---|
| 9,793,288 | B2 | 10/2017 | Yada et al. |
| 2013/0043455 | A1 | 2/2013 | Bateman |
| 2016/0181271 | A1 | 6/2016 | Yada et al. |
| 2017/0004974 | A1* | 1/2017 | Manna .............. H01L 21/02164 |
| 2017/0221559 | A1 | 8/2017 | Chen et al. |

OTHER PUBLICATIONS

U.S. Appl. No. 15/470,453, filed Mar. 27, 2017, SanDisk Technologies Inc.
U.S. Appl. No. 15/603,989, filed May 24, 2017, SanDisk Technologies Inc.
U.S. Appl. No. 15/633,092, filed Jun. 26, 2017, SanDisk Technologies Inc.
U.S. Appl. No. 15/692,230, filed Aug. 31, 2017, SanDisk Technologies Inc.
U.S. Appl. No. 15/805,627, filed Nov. 7, 2017, SanDisk Technologies Inc.

* cited by examiner

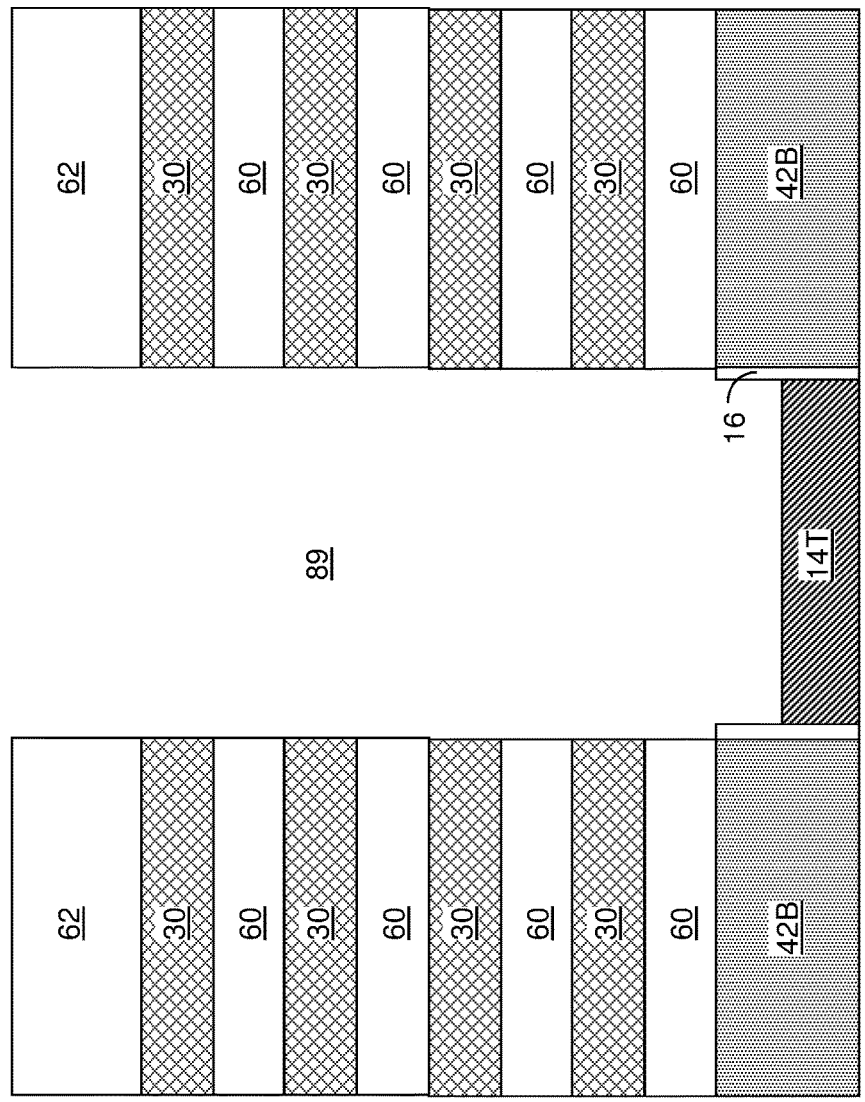

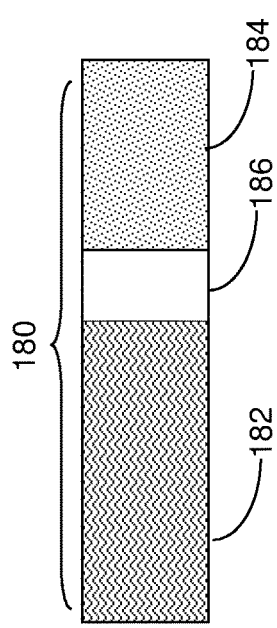
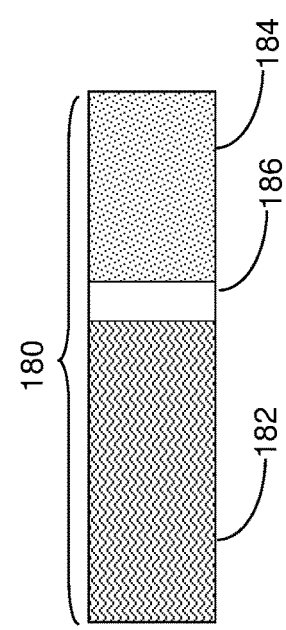

US 10,354,859 B1

THREE-DIMENSIONAL RESISTIVE RANDOM ACCESS MEMORY DEVICE CONTAINING SELECTIVELY GROWN AMORPHOUS SILICON-CONTAINING BARRIER AND METHOD OF MAKING THE SAME

FIELD

The present disclosure relates generally to the field of semiconductor devices and specifically to a resistive random access memory (ReRAM) device including selectively grown amorphous silicon-containing barrier portions and methods of manufacturing the same.

BACKGROUND

Resistive memory devices are non-volatile memory devices employing non-volatile and reversible changes in resistance in a thin film with application of electrical voltage bias. As a "non-volatile" memory device, data stored in the resistive memory element does not change the value even when the power is turned off. In other words, the stored value of the data in any functional resistive memory device remains the same until the resistive memory element is reprogrammed, for example, in an erase operation or in a programming operation. The data stored in the non-volatile memory device can be reversed only when an electrical bias is applied in a direction that changes the resistive state of the memory device.

The resistive memory element is typically provided as a thin film, which is a solid-state material. Data can be stored in a resistive memory element by changing the resistance of the thin film. The thin film is referred to as a memory film or a read/write film. Examples of resistive random access memory (ReRAM) devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a method of forming a resistive memory device is provided, which comprises: forming an alternating stack of insulating layers and electrically conductive layers that extend along a first horizontal direction over a substrate, wherein the insulating layers comprise a silicon oxide material; selectively silylating sidewalls of the insulating layers with a chemical including at least one silyl group without silylating sidewalls of the electrically conductive layers; forming silicon-containing barrier material portions at least by selectively growing a first silicon-containing barrier material from surfaces of the electrically conductive layers without growing the first silicon-containing barrier material from silylated surfaces of the insulating layers; forming a memory material layer on the silicon-containing barrier material portions and the sidewalls of the insulating layers; and forming a vertical conductive line on the memory material layer.

According to another aspect of the present disclosure, a resistive memory device is provided, which comprises: an alternating stack of insulating layers and electrically conductive layers that extend along a first horizontal direction, wherein sidewalls of the electrically conductive layers are vertically coincident with sidewalls of the insulating layers; discrete silicon-containing barrier material portions located on a respective one of the sidewalls of the electrically conductive layers and vertically spaced among one another; a memory material layer contacting the silicon-containing barrier material portions and the sidewalls of the insulating layers; and a vertical conductive line contacting the memory material layer.

Figure 2A:
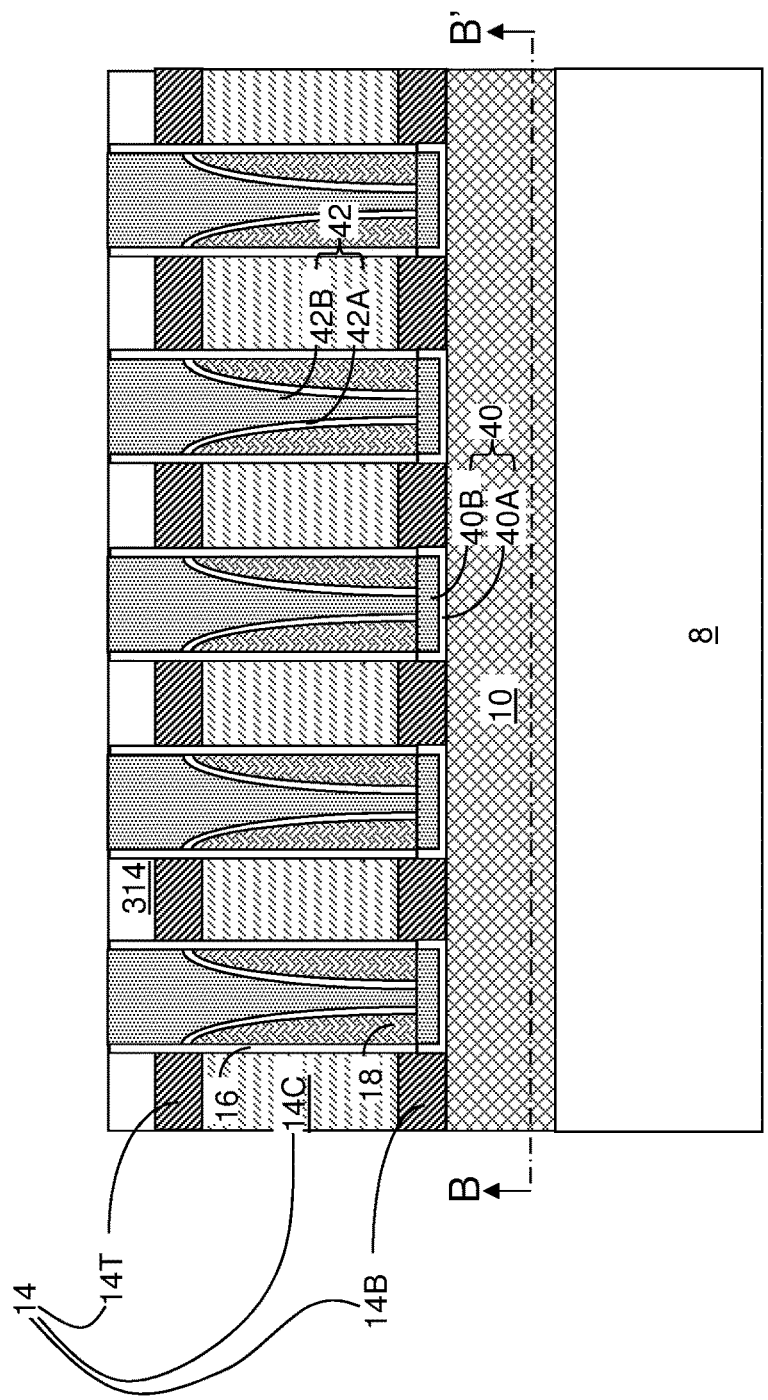
FIG. 2A is a vertical cross-sectional view of an exemplary structure after formation of bit line access transistors and dielectric fill layers according to an embodiment of the present disclosure.

The vertical plane A-A' is the plane of the cross-section for FIG. 2A.

Figure 3A:
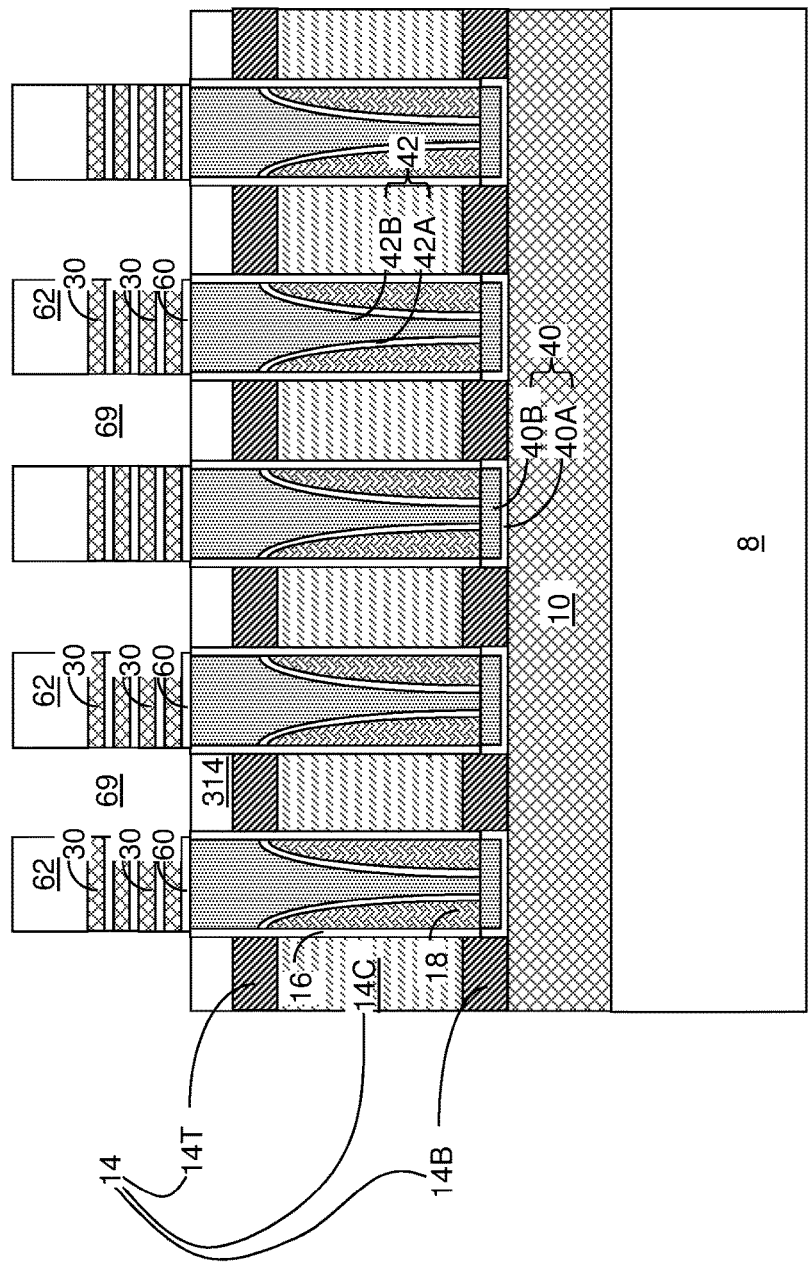

FIG. 3A is a vertical cross-sectional view of the exemplary structure after formation of alternating stacks of insulating layers and conductive material layers according to an embodiment of the present disclosure.

Figure 3B:
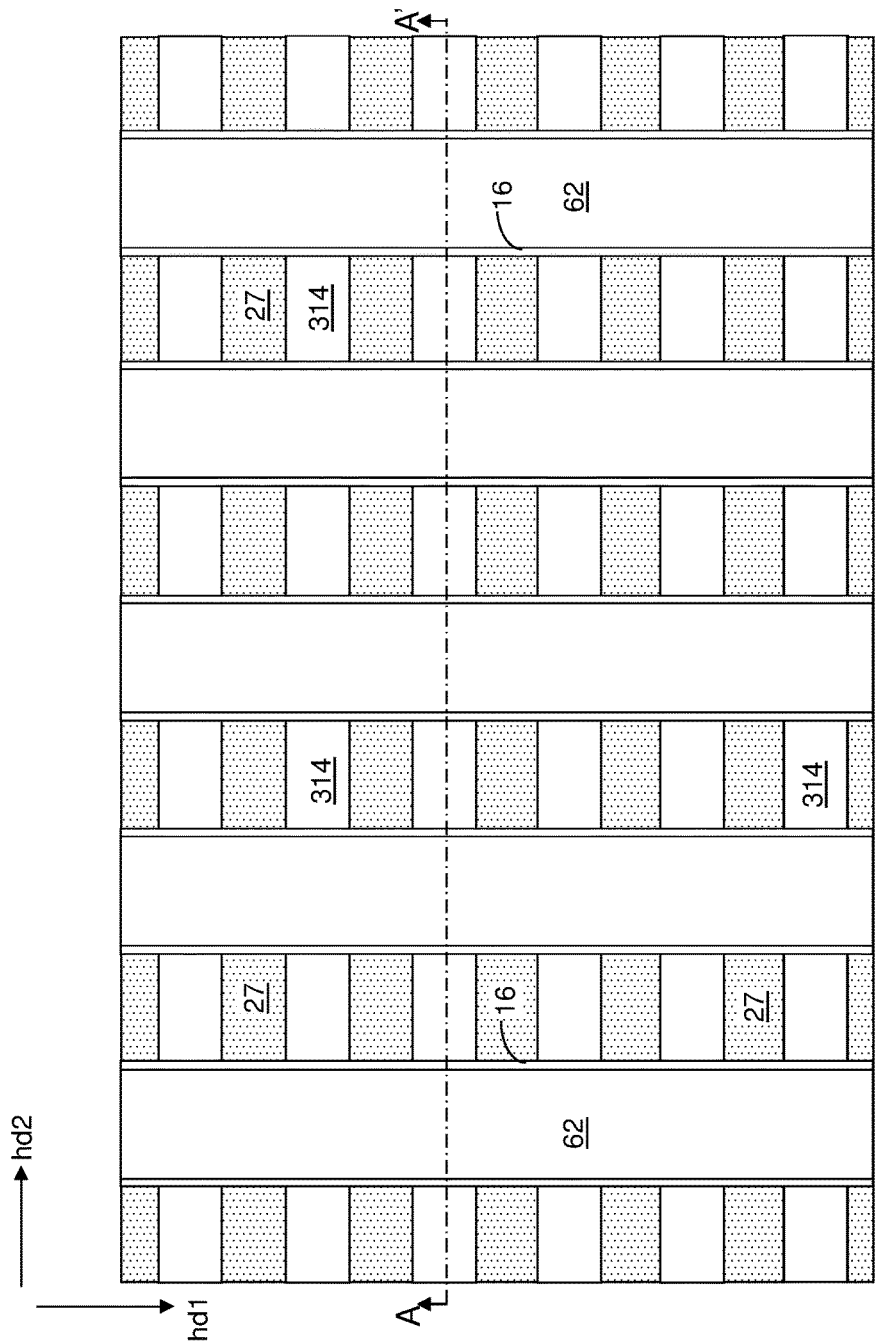

FIG. 3B is a top-down view of the exemplary structure of FIG. 3A. The vertical plane A-A' is the plane of the cross-section for FIG. 3A.

Figure 4A:
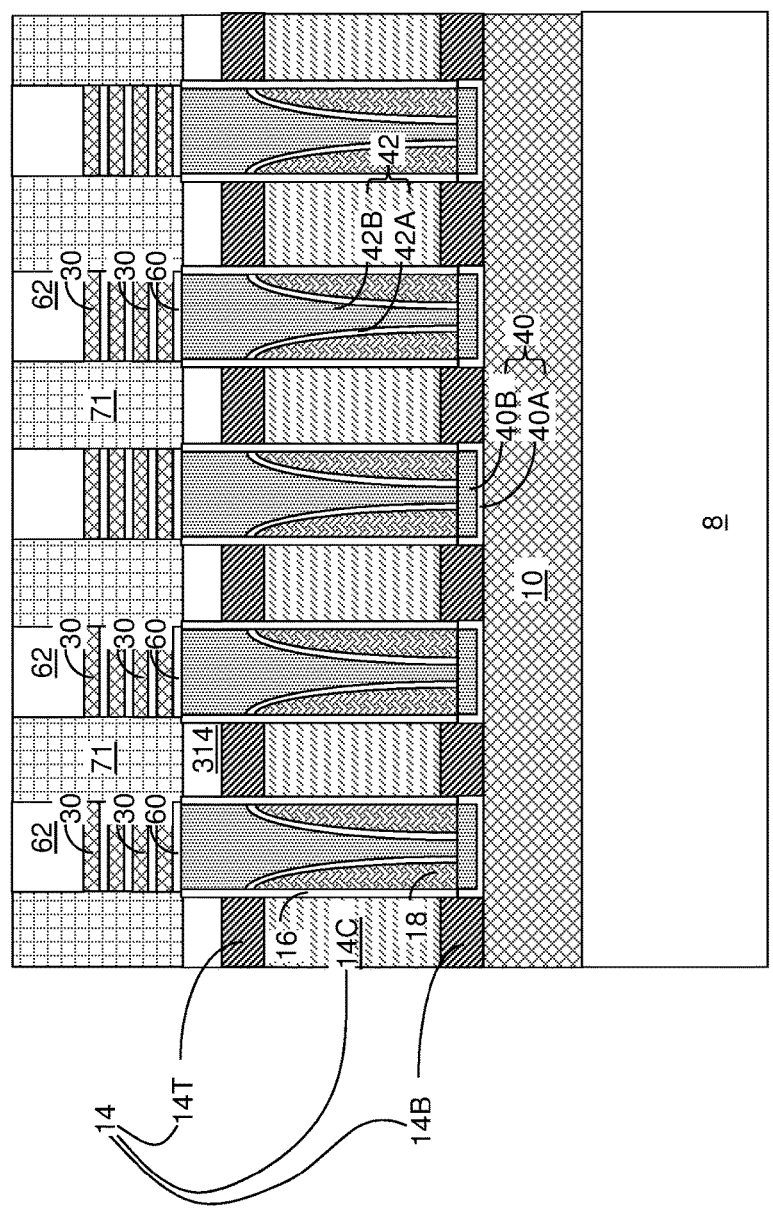

FIG. 4A is a vertical cross-sectional view of the exemplary structure after formation of sacrificial rail structures according to an embodiment of the present disclosure.

Figure 4B:
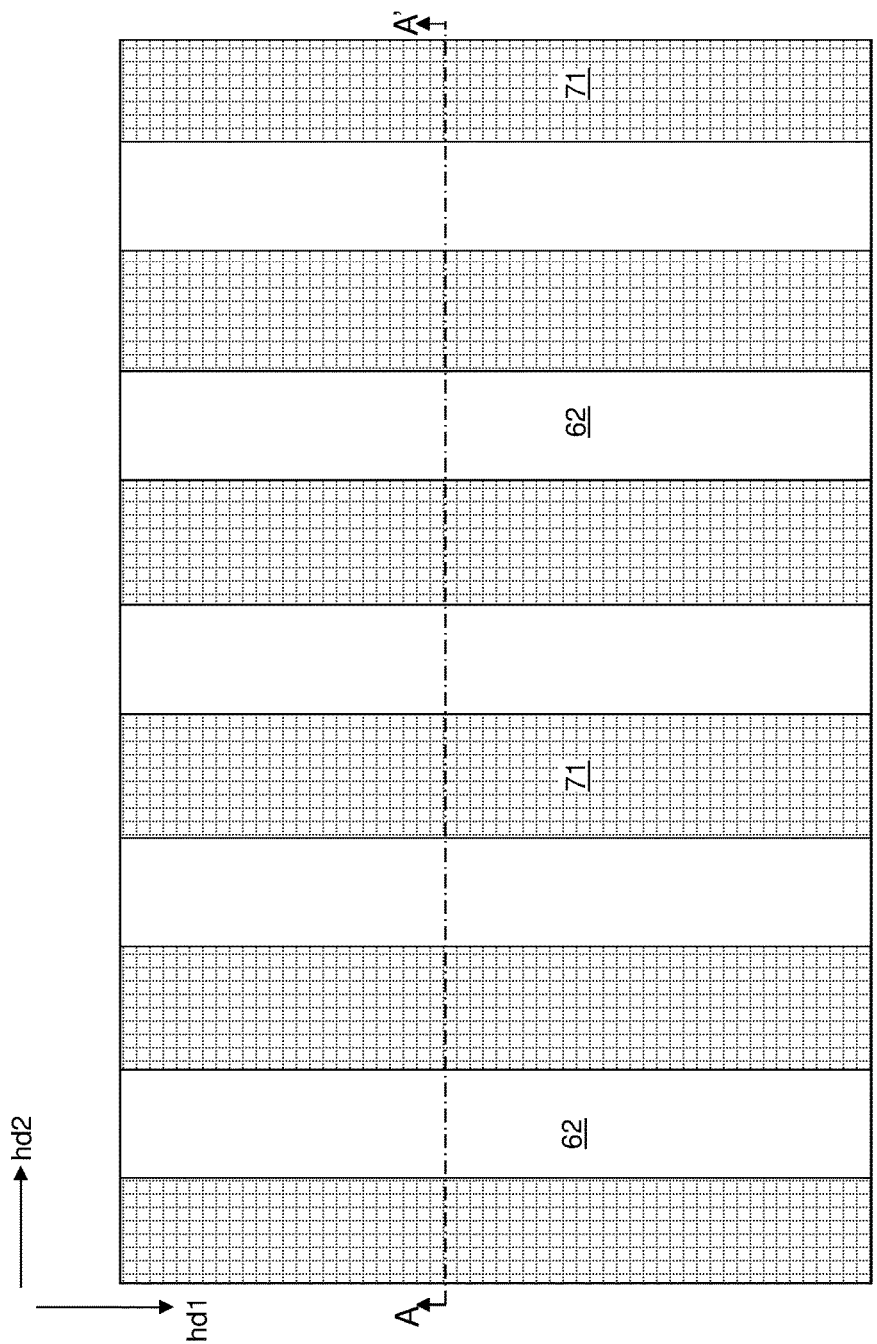

FIG. 4B is a top-down view of the exemplary structure of FIG. 3A. The vertical plane A-A' is the plane of the cross-section for FIG. 3A.

Figure 5A:
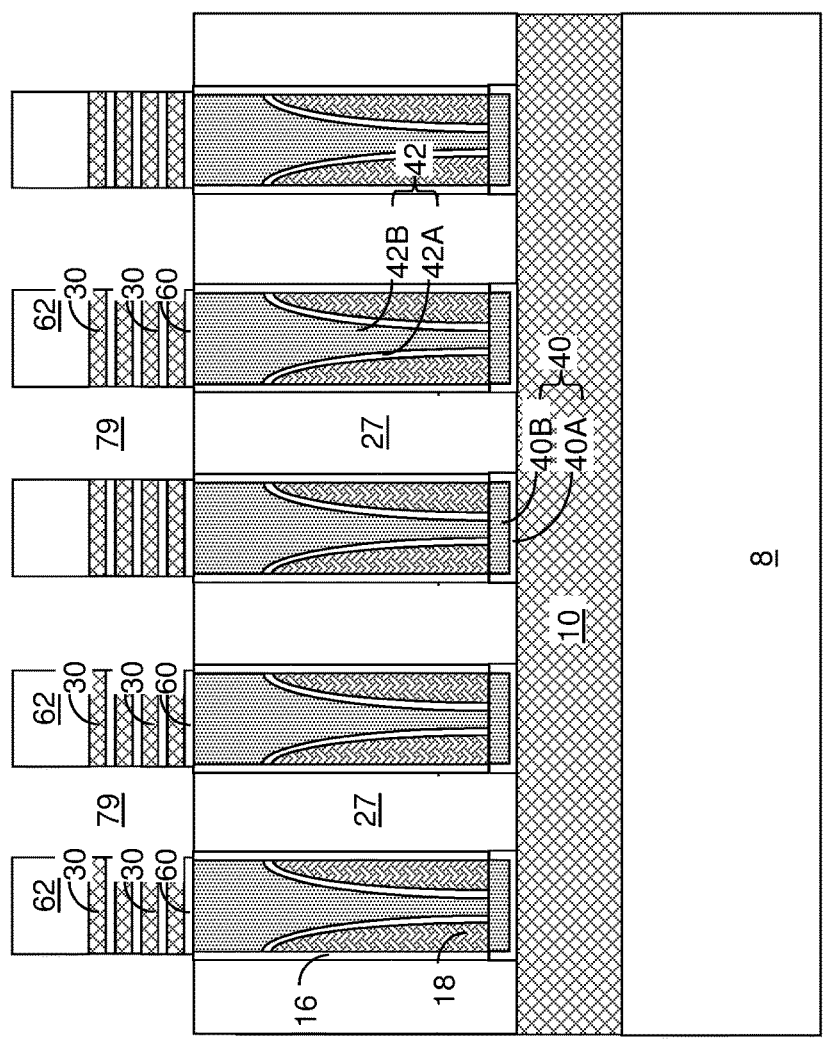

FIG. 5A is a vertical cross-sectional view of the exemplary structure after formation of pillar cavities according to an embodiment of the present disclosure.

Figure 5B:
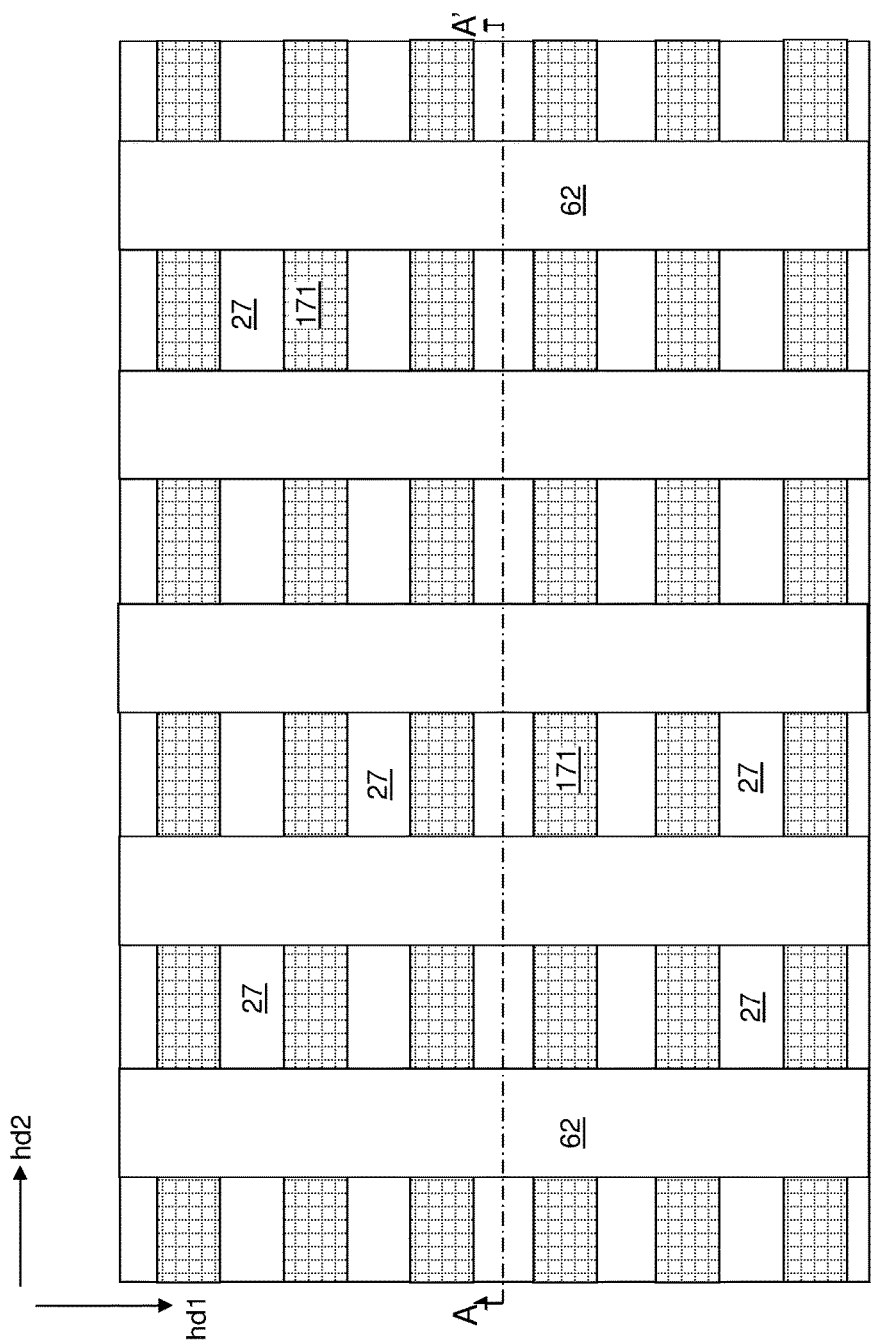

FIG. 5B is a top-down view of the exemplary structure of FIG. 5A. The vertical plane A-A' is the plane of the cross-section for FIG. 5A.

Figure 6A:
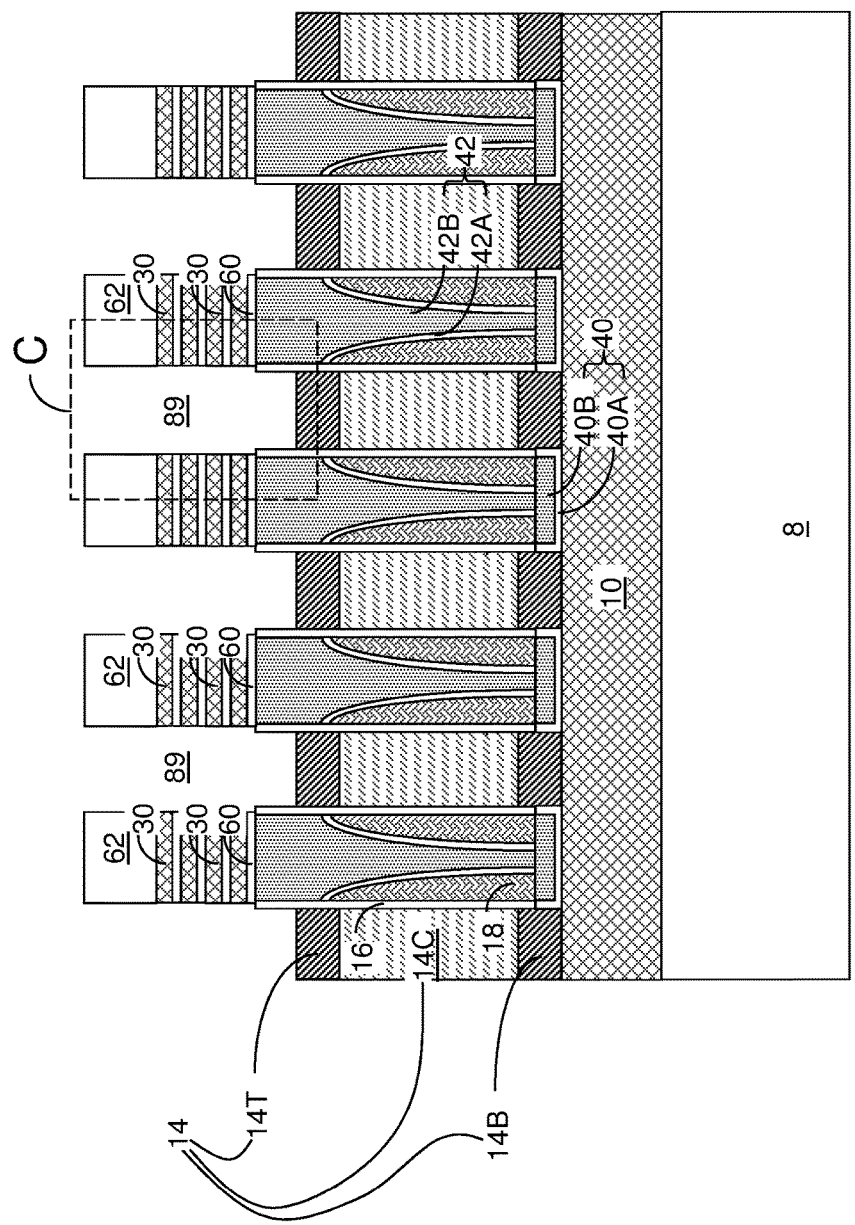

FIG. 6A is a vertical cross-sectional view of the exemplary structure after formation of dielectric pillar structures and memory openings according to an embodiment of the present disclosure.

Figure 6B:
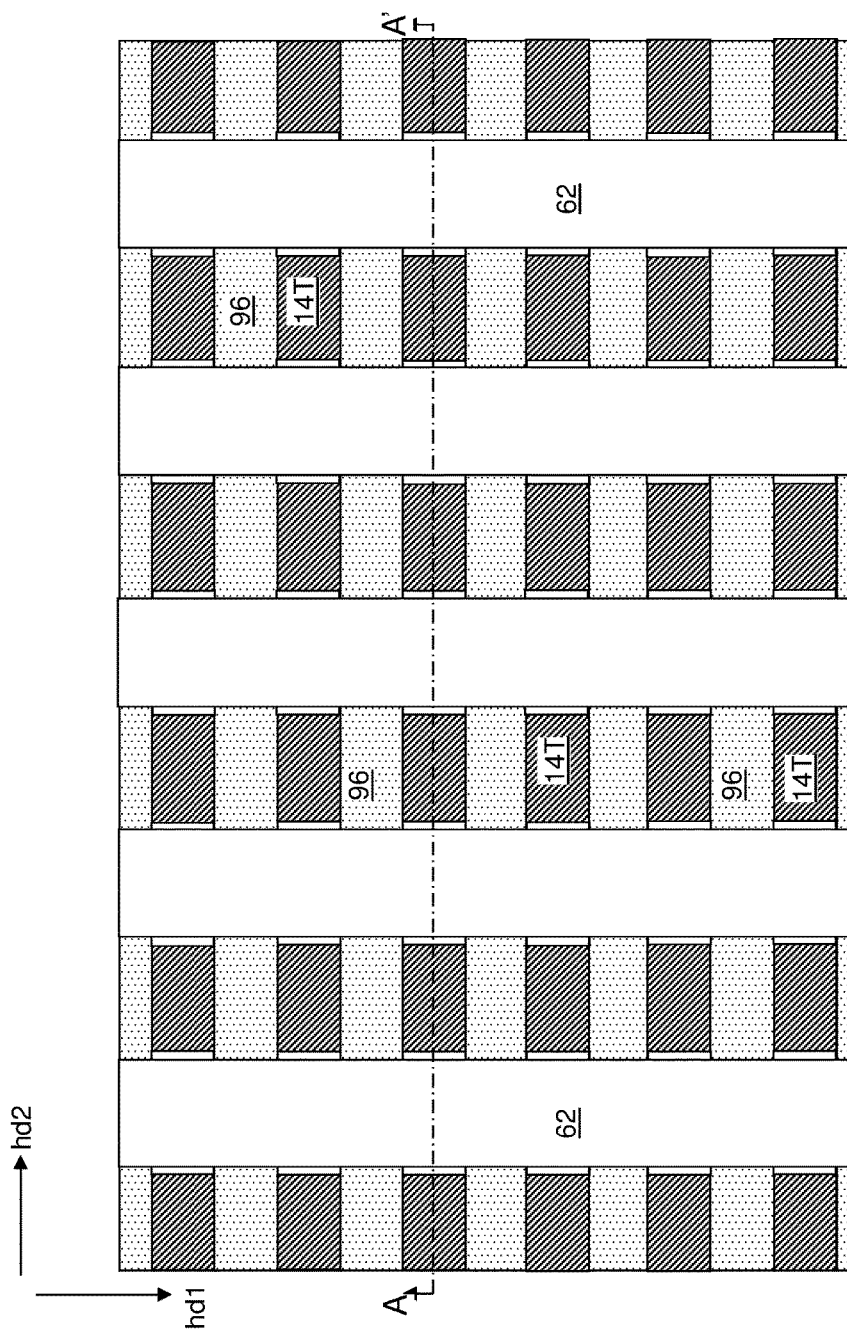

FIG. 6B is a top-down view of the exemplary structure of FIG. 6A. The vertical plane A-A' is the plane of the cross-section for FIG. 6A.

FIGS. 7A-7G are sequential vertical cross-sectional views of a memory opening of the exemplary structure in region C of FIG. 6A during formation of silicon-containing barrier material portions, a memory material layer, and a vertical conductive line according to an embodiment of the present disclosure.

Figure 7B:
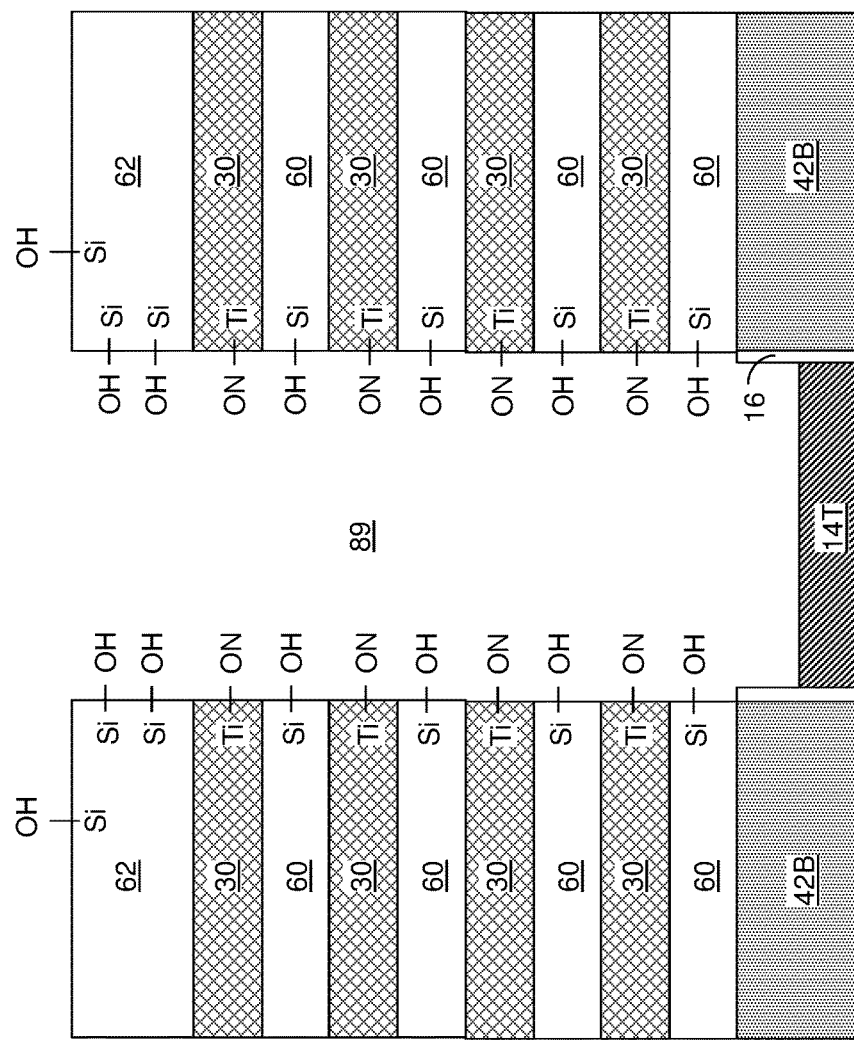
Figure 7C:
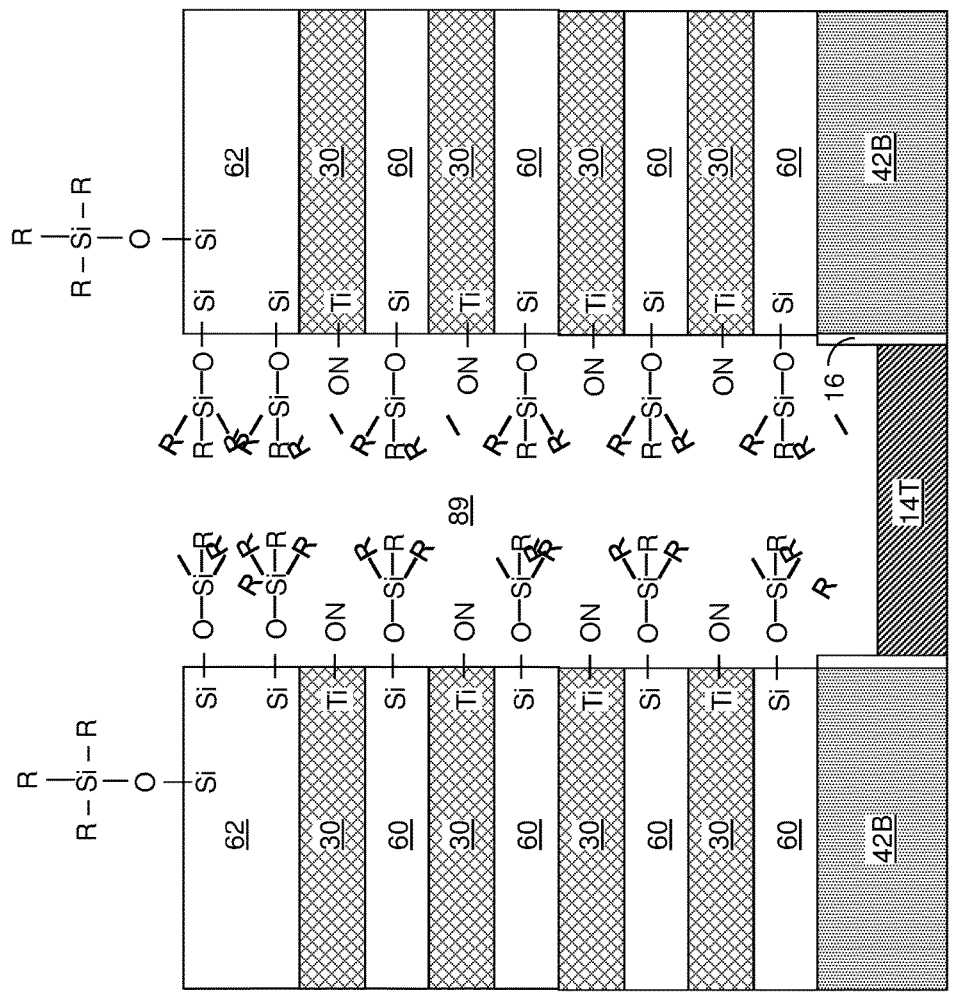
Figure 7D:
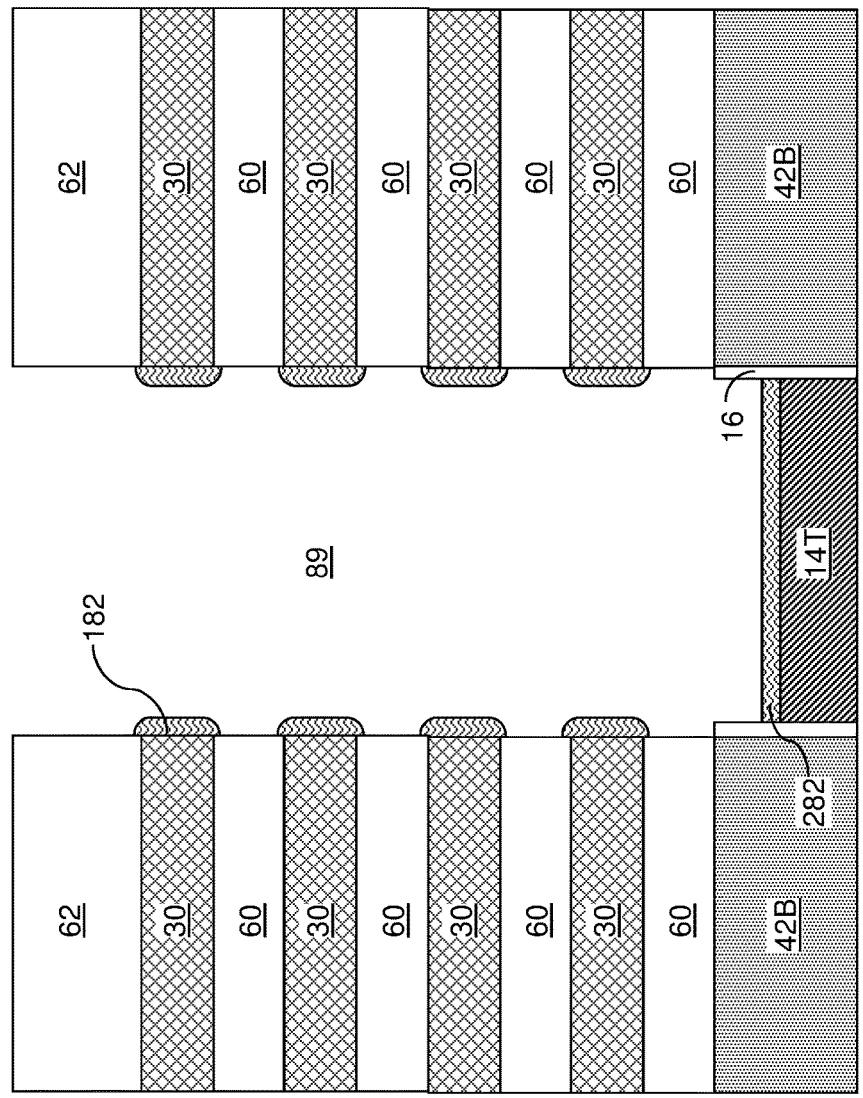
Figure 7E:
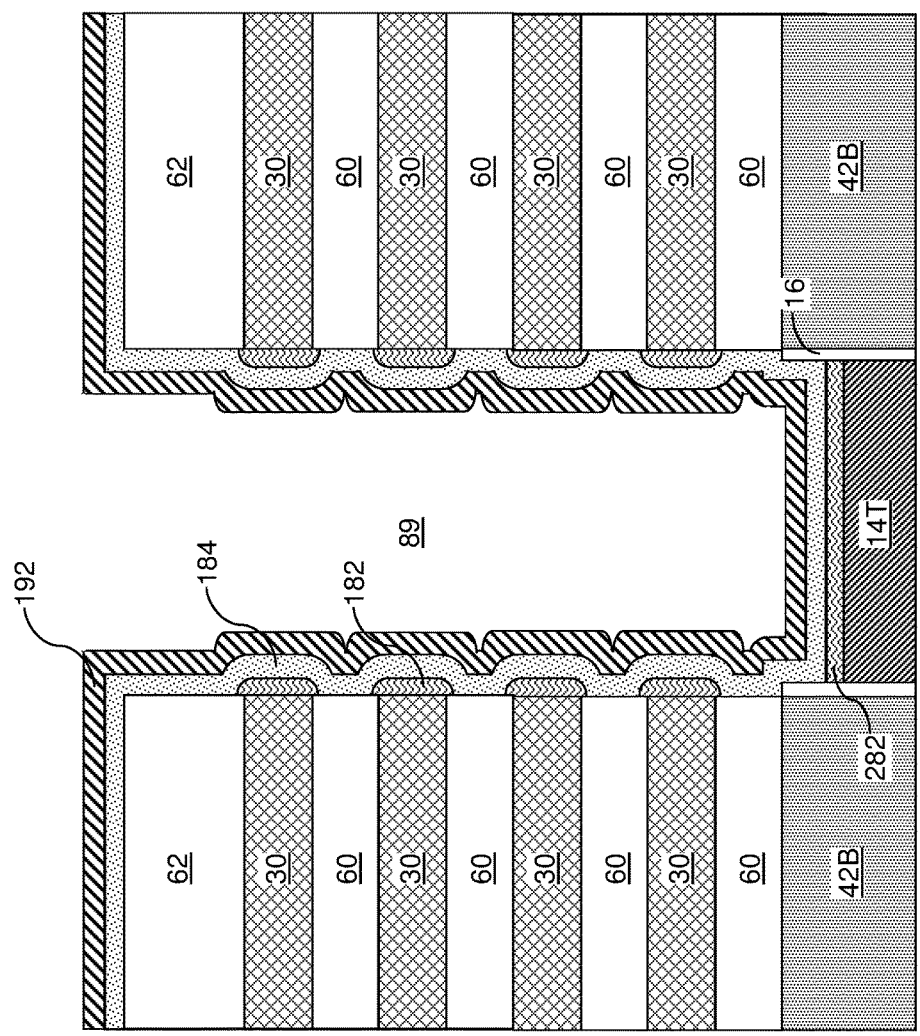
Figure 7F:
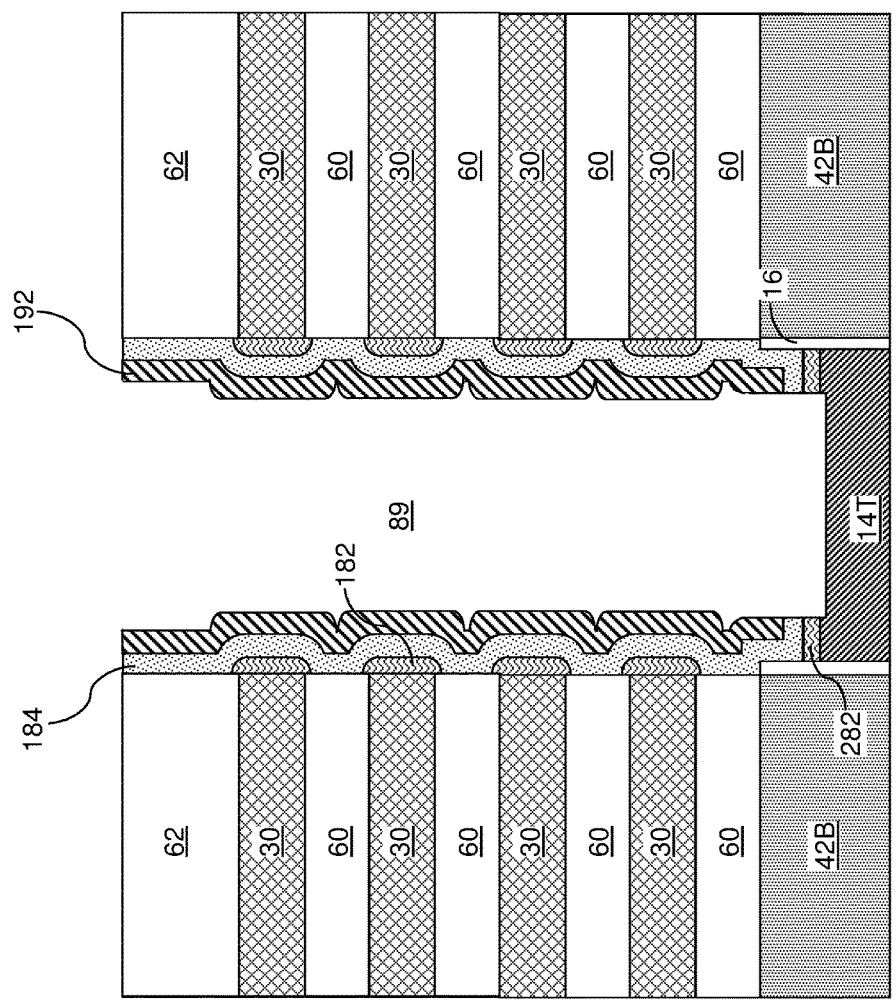
Figure 7G:
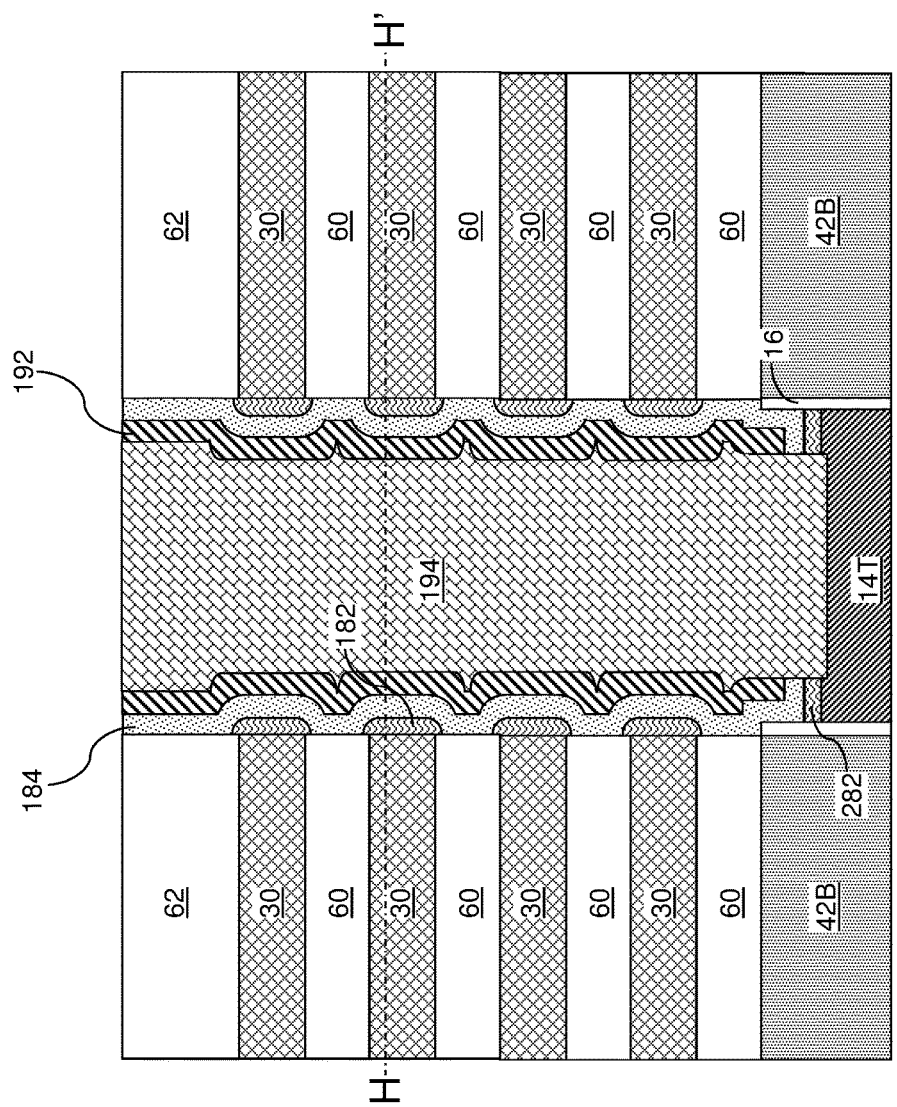
Figure 7H:
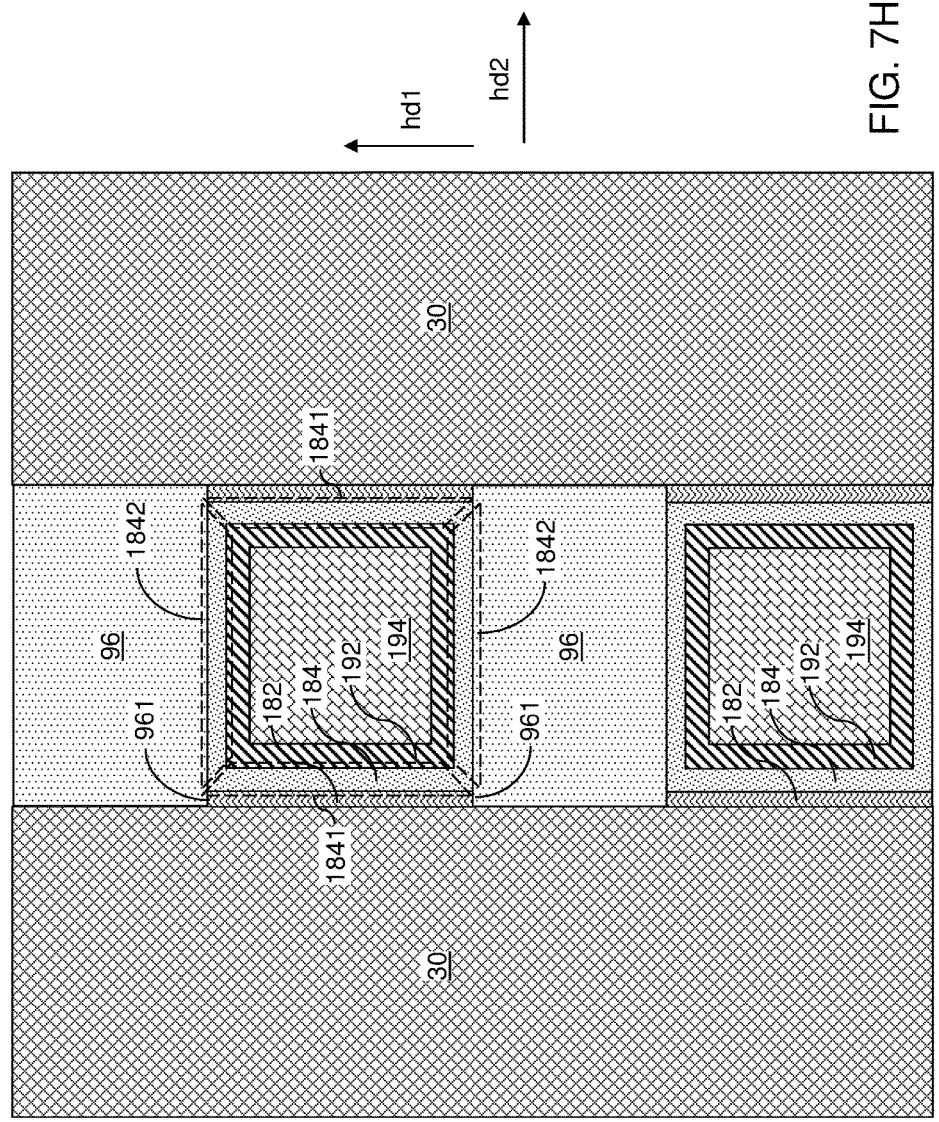

FIG. 7H is a horizontal cross-sectional view of a region of the exemplary structure along a horizontal cross-sectional plane H-H' in FIG. 7G.

Figure 8:
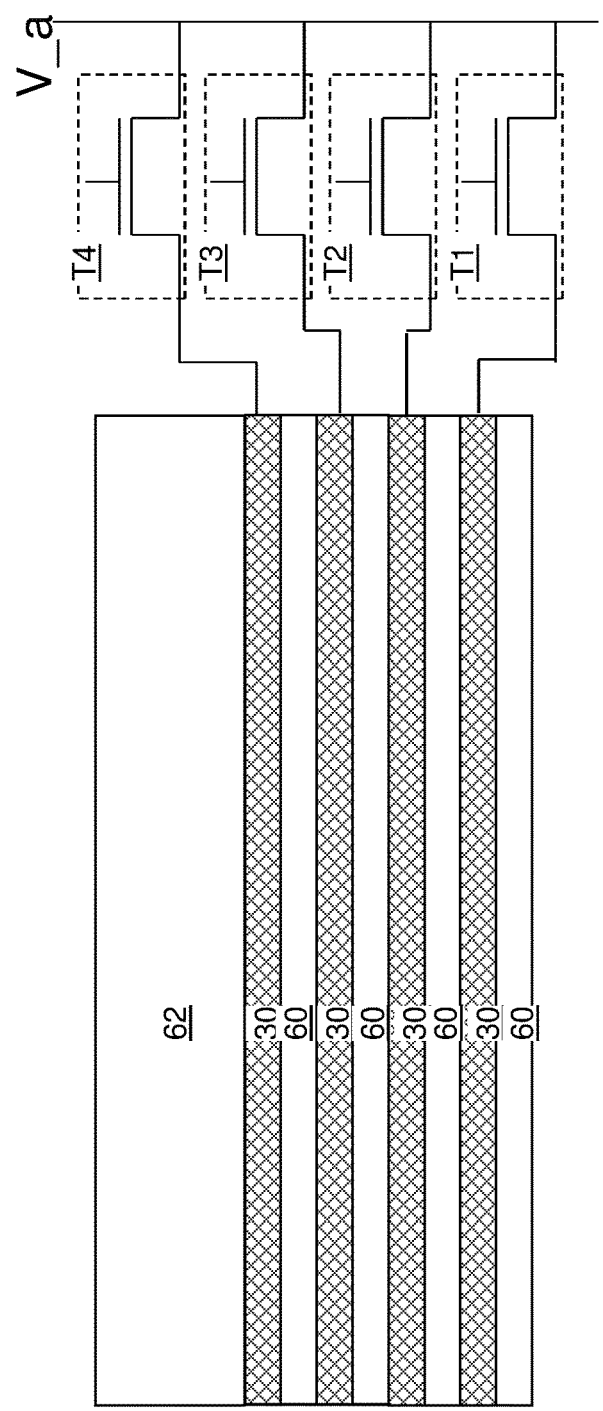

FIG. 8 is a schematic vertical cross-sectional view illustrating access transistors connected to the electrically conductive lines that function as word lines according to an embodiment of the present disclosure.

FIG. 9A is a schematic side view of a memory cell in a reset state according to an embodiment of the present disclosure.

FIG. 9B is a schematic side view of a memory cell in a set state according to an embodiment of the present disclosure.

FIGS. 10A-10D are sequential vertical cross-sectional views of the memory opening of the exemplary structure in an alternative embodiment in which optional additional processing steps are employed.

DETAILED DESCRIPTION

Resistive memory material portions of each ReRAM memory cell can be located within a continuous resistive memory material layer. Such configurations are prone to leakage through inactive portions of the continuous resistive memory material layer located between memory levels, i.e., between levels of electrically conductive layers that function as word lines.

Embodiments of the present disclosure provide a resistive random access memory device that that contains selectively grown amorphous silicon-containing barrier portions that provide reduced leakage across neighboring pairs of word lines the various aspects of which are described below. The embodiments of the disclosure can be employed to form various semiconductor devices such as three-dimensional monolithic memory array devices comprising ReRAM devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

Figure 1:
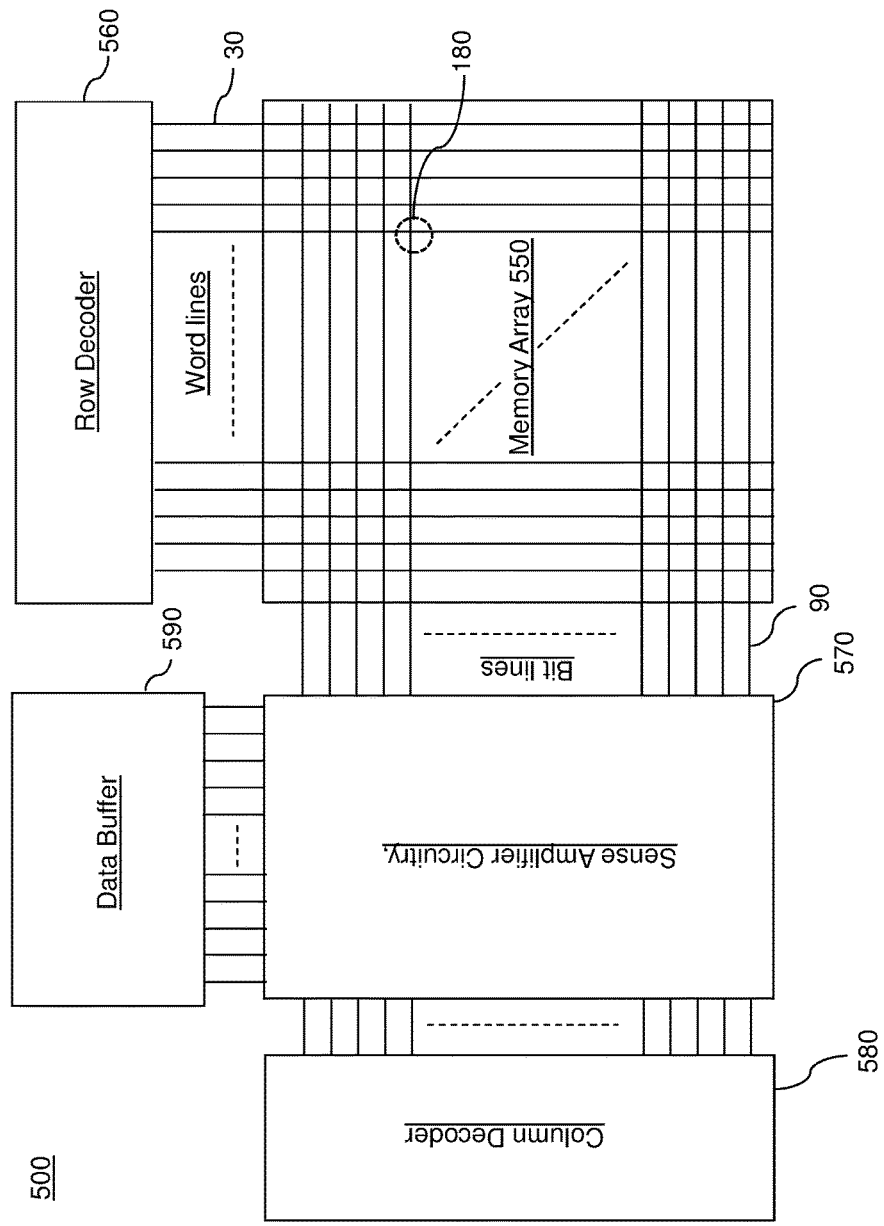
FIG. 1 is a schematic diagram of a memory device including resistive memory cells of the present disclosure in an array configuration.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a row decoder 560 connected to the word lines, a sense circuitry 570 (e.g., a sense amplifier and other bit line control circuitry) connected to the bit lines, a column decoder 580 connected to the bit lines and a data buffer 590 connected to the sense circuitry. Multiple instances of the resistive memory cells 180 are provided in an array configuration that forms the random access memory device 500. It should be noted that the location and interconnection of elements are schematic and the elements may be arranged in a different configuration.

Each resistive memory cell 180 includes a resistive memory material having at least two different resistive states. The resistive memory material portion is provided between a first electrode and a second electrode within each resistive memory cell 180. Configurations of the resistive memory cells 180 are described in detail in subsequent sections. The resistive memory material portion may include a non-filamentary barrier modulated cell (BMC), which includes a barrier and an electrically conductive metal oxide whose resistivity is switched by at least one of oxygen ion and/or oxygen vacancy diffusion in response to an application of an electric field thereto.

Figure 2B:
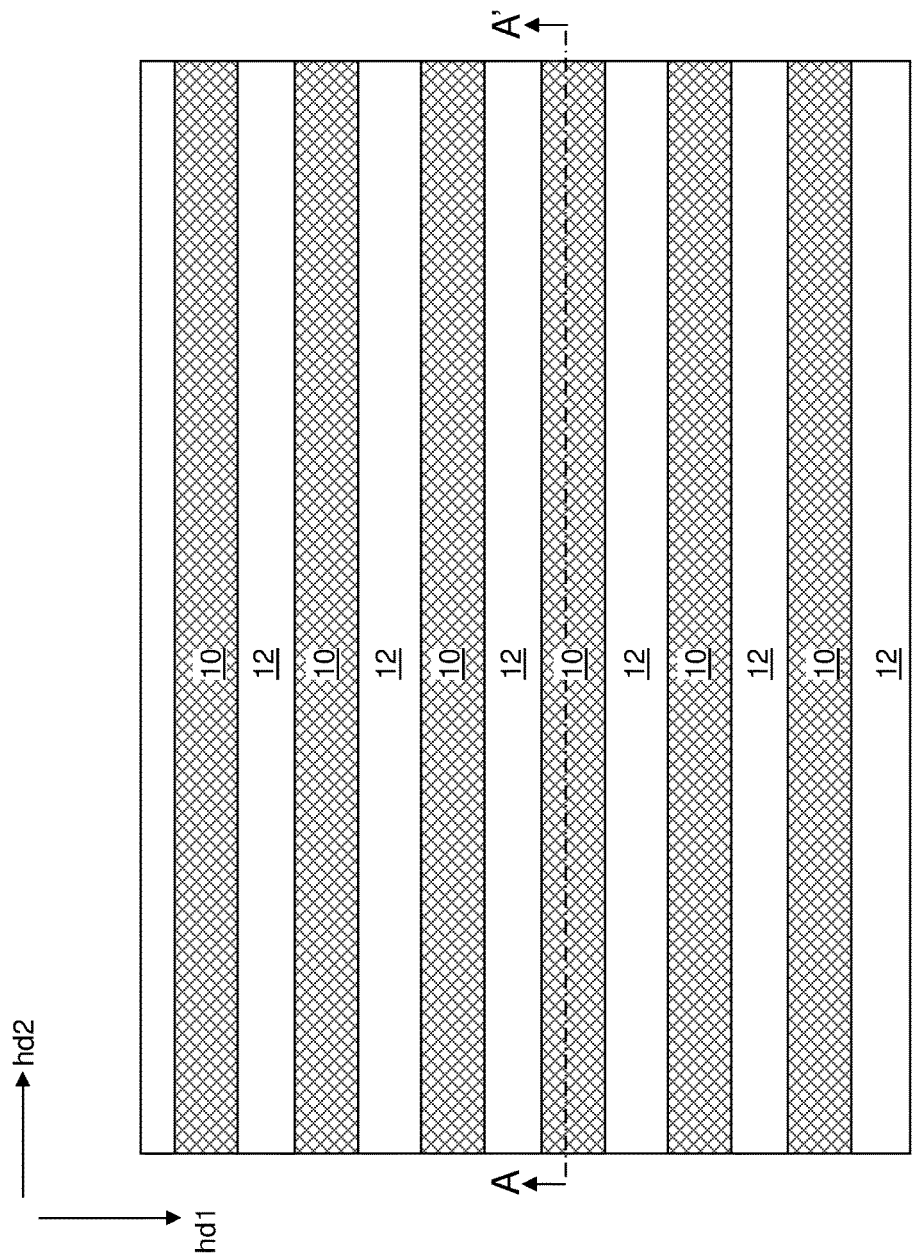
FIG. 2B is a horizontal cross-sectional view of the exemplary structure of FIG. 2A along the horizontal plane B-B' of FIG. 2A.
Figure 2C:
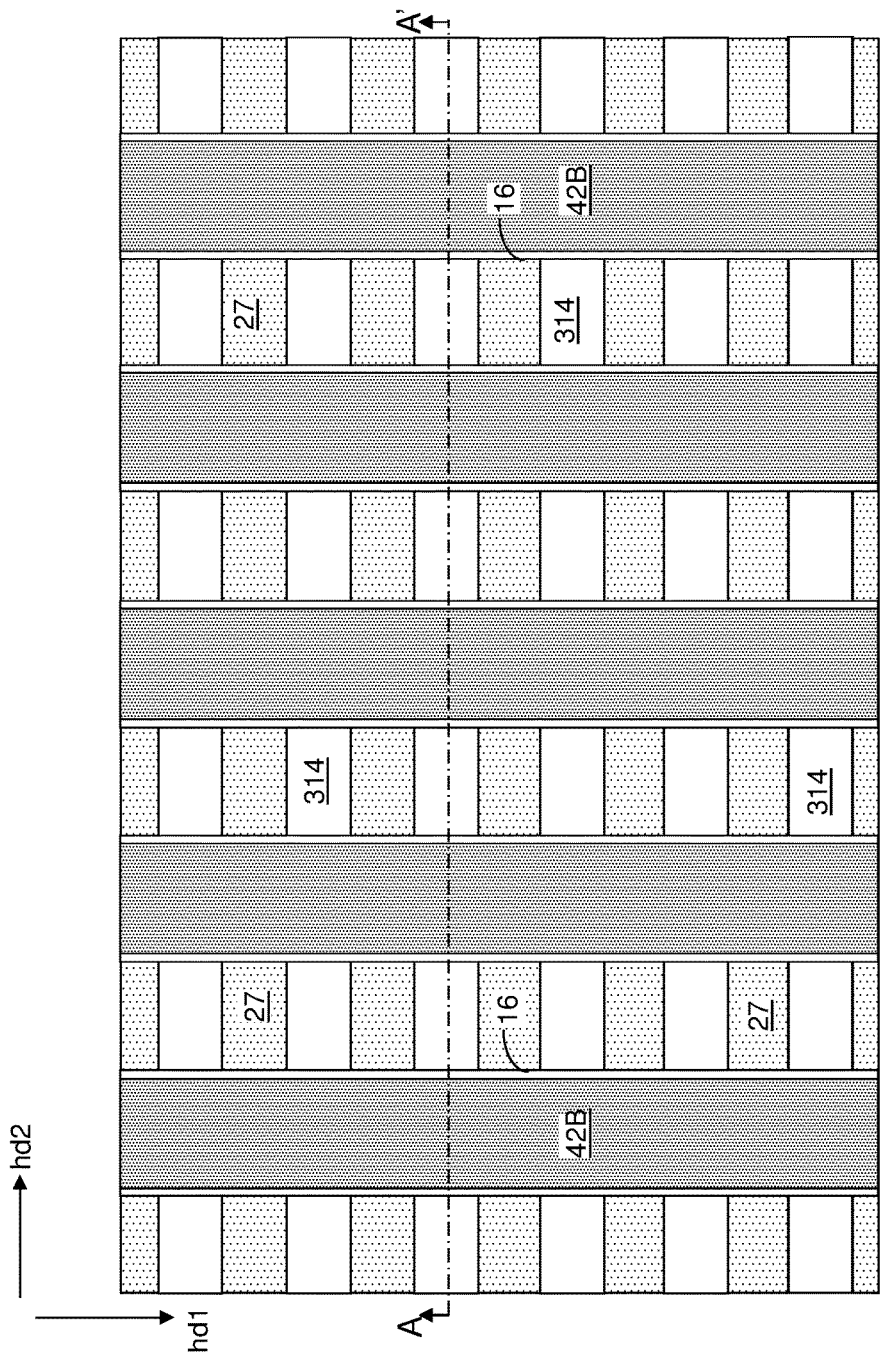
FIG. 2C is a see-through top-down view of the exemplary structure of FIG. 2A.

Referring to FIGS. 2A-2C, an exemplary structure according to an embodiment of the present disclosure is illustrated, which can be an in-process ReRAM device. The ReRAM device has three-dimensional vertical bit line ("VBL") type device configuration. As used herein, a "prototype" structure or an "in-process" structure refers to a transient structure that is subsequently modified in the shape or composition of at least one component therein.

The exemplary structure includes a substrate 8, which includes an insulating layer at an upper portion thereof. In one embodiment, the substrate 8 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 8. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the second horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 can be patterned employing a combination of lithographic methods and an anisotropic etch such that each patterned portion of the semiconductor layer stack 14 is a rail structure that laterally extend along the first horizontal direction, and is laterally spaced apart among one another along the second horizontal direction by line trenches that extend along the first horizontal direction.

A spacer dielectric layer 40 can be formed at the bottom the line trenches by depositing a self-planarizing dielectric material (such as spin-on glass) or by filling the trenches with a dielectric material (such as organosilicate glass), planarizing the deposited dielectric material, and recessing the dielectric material selective to the rail structures including the materials of the semiconductor layer stack 14. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer. In one embodiment, each spacer dielectric liner 40 can include a first dielectric liner 40A such as a silicon nitride liner and a second dielectric liner 40B such as a silicon oxide liner.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the line trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the line trenches are filled with at least one dielectric material. Excess portions of the at least one dielectric material can be removed from above the horizontal plane including the top surfaces of the rail structures (including the materials of the semiconductor layer stack 14) by a planarization process, which can employ, for example, chemical mechanical planarization. Each remaining portion of the deposited dielectric material in the trenches constitutes a dielectric rail structure 42, which is also referred to as an access transistor level dielectric rail. In one embodiment, each dielectric rail structure 42 can include a dielectric rail liner 42A and a dielectric rail fill material portion 42B. Each dielectric rail structure 42 extends along the first horizontal direction hd1.

The rail structures that include the materials of the semiconductor layer stack 14 can be patterned to form a two-dimensional array of pillar cavities that extend to the top surfaces of the separator dielectric material portions 12. For example, a photoresist layer can be applied over the rail structures that include the materials of the semiconductor layer stack 14 and the dielectric rail structures 42, and can be lithographically patterned to form openings in areas overlying the separator dielectric material portions 12. A one-dimensional array of line patterns can be employed, in which each line pattern laterally extends along the second horizontal direction. An anisotropic etch that removes semiconductor materials of the semiconductor layer stack 14 selective to the material of the access transistor dielectric rails 42 can be performed employing the patterned photoresist layer as an etch mask to form the two-dimensional array of pillar cavities. After removal of the photoresist layer, the pillar cavities can be filled with a dielectric material to form dielectric pillar spacers 27.

Each patterned portion of the semiconductor layer stack 14 can be a semiconductor pillar structure (14B, 14C, 14T) including a vertical stack of a bottom active region 14B, a semiconductor channel 14C, and a top active region 14T. The dielectric pillar spacers 27 are located between each neighboring pair of semiconductor pillar structures (14B, 14C, 14T) that are laterally spaced apart along the first horizontal direction hd1. Each alternating sequence of dielectric pillar spacers 27 and semiconductor pillar structures (14B, 14C, 14T) that extend along the first horizontal direction hd1 forms a composite rail structure (14B, 14C, 14T, 27). The composite rail structures (14B, 14C, 14T, 27) are laterally spaced from one another along the second horizontal direction hd2, as shown in FIG. 2C.

Optionally, top surfaces of the top active regions 14T may be optionally vertically recessed, and a sacrificial material can be deposited to temporarily protect the semiconductor pillar structures (14B, 14C, 14T) during subsequent processing steps. The sacrificial material can be planarized so that the top surfaces of the remaining sacrificial material portions are coplanar with the top surfaces of the dielectric rail structures 42. The sacrificial material portions are herein referred to as sacrificial cap structures 314. If the sacrificial cap structures 314 are present, each composite rail structure (14B, 14C, 14T, 27, 314) includes a row of sacrificial cap structures 314.

Each composite rail structure (14B, 14C, 14T, 27, 314) includes remaining portions of the semiconductor layer stack 14 and the dielectric pillar spacers 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 8. In one embodiment, each dielectric rail structure 42 can include at least one dielectric material such as silicon nitride and/or silicon oxide. The dielectric rail structures 42 and the composite rail structures (14T, 14C, 14B, 27, 314) alternate along the second horizontal direction hd2.

Referring to FIGS. 3A and 3B, a continuous alternating stack of continuous electrically conductive layers and continuous insulating layers can be formed over the dielectric rail structures 42 and the composite rail structures (14T, 14C, 14B, 27, 314) as stacks of blanket (unpatterned) layers. A continuous insulating cap layer can be formed over the continuous alternating stack of the electrically conductive layers and the insulating layers.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the continuous insulating cap layer and the alternating stack of the continuous electrically conductive layers and the continuous insulating layers are patterned to form line stack rail structures. For example, a photoresist layer can be applied over the continuous insulating cap layer, and can be lithographically patterned to mask the areas of the dielectric rail structures 42 while not covering the areas of the composite rail structures (14T, 14C, 14B, 27, 314). In one embodiment, sidewalls of the patterned photoresist layer can be laterally offset from the boundaries between the dielectric rail structures 42 and the composite rail structures (14T, 14C, 14B, 27, 314) to ensure that the entire areas of the composite rail structures (14T, 14C, 14B, 27, 314) are not covered by the patterned photoresist layer.

An anisotropic etch can be performed through the continuous insulating cap layer and the alternating stack of the continuous electrically conductive layers and the continuous insulating layers. Line trenches 69 laterally extending along the first horizontal direction hd1 and laterally spaced apart along the second horizontal direction hd2 can be formed. The line trenches 69 are herein referred to as memory level line trenches. Further, the sacrificial cap structures 314 can be removed from underneath the line trenches 69 to physically expose the top surfaces of the top active regions 14T of the vertical field effect transistors.

The line trenches divide the continuous insulating cap layer and the alternating stack of the continuous electrically conductive layers and the continuous insulating layers into multiple rail structures that extend along the first horizontal direction hd1 and laterally spaced apart along the second horizontal direction hd2. The rail structures are herein referred to as line stack rail structures. Each line stack rail structure overlies a dielectric rail structure 42, extends along the first horizontal direction hd1, and is laterally spaced apart from one another along the second horizontal direction hd2.

Each patterned portion of the continuous insulating cap layer is herein referred to as an insulating cap layer 62, which may be an insulating cap strip. Each patterned portion of the continuous electrically conductive layers is herein referred to as an electrically conductive layer 30 (which may function as word lines), which may be an electrically conductive strip. Each patterned portion of the continuous insulating layer is herein referred to as an insulating layer 60, which may be an insulating strip. As used herein, a "strip" refers to an elongated line, which may have a uniform width throughout or may have laterally protruding or laterally recessed regions. In one embodiment, each of the insulating cap layers 62, the electrically conductive layers 30, and the insulating layers 60 can have a respective uniform width that is invariant along the first horizontal direction hd1. Thus, each line stack rail structure (30, 60, 62) includes an alternating stack of electrically conductive layers 30 and insulating layers 60, and an insulating cap portion 62. In one embodiment, each line stack rail structure (30, 60, 62) can have a lesser width along the second horizontal direction hd2 than the underlying dielectric rail structure 42, and can be entirety within the area of the underlying dielectric rail structure 42.

In one embodiment, the electrically conductive layers 30 comprise a first electrically conductive material. In one embodiment, the first electrically conductive material can be a conductive metal nitride. In one embodiment, the first electrically conductive material can be selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1. Alternatively, the electrically conductive layers 30 may comprise a metal instead of or in addition to a metal nitride. In another embodiment, the first electrically conductive material can include a doped semiconductor material. The insulating layers 60 and the insulating cap portion 62 may comprise any suitable insulating material, such as silicon oxide.

Each line stack rail structure (30, 60, 62) includes a respective alternating stack of insulating layers 60 and electrically conductive layers 30 that are laterally spaced apart among one another by line trenches 69 that extend along the first horizontal direction hd1. In one embodiment, the insulating layers 60 can include, and/or consist essentially of, a silicon oxide material such as undoped silicate glass or doped silicate glass, and the electrically conductive layers 30 can include, and/or consist essentially of, titanium nitride.

The thickness of the electrically conductive layers 30 can be in a range from 6 nm to 60 nm, although lesser and greater thicknesses can also be employed. The thickness of the insulating lines 60 can be in a range from 6 nm to 60 nm, although lesser and greater thicknesses can also be employed. The thickness of the insulating cap portions 62 can be in a range from 6 nm to 300 nm, although lesser and greater thicknesses can also be employed.

A pair of an electrically conductive layer 30 and an insulating layer 60 can constitute a unit of repetition in the alternating stack (30, 60) of the electrically conductive layers 30 and the insulating layers 60. The total number of repetitions can be in a range from 8 to 1,024, although lesser and greater number of repetitions can also be employed. Thus, a plurality of alternating stacks (30, 60) of insulating layers 60 (which may be insulating strips) and electrically conductive layers 30 (which may be electrically conductive strips) is formed over a substrate 8. Each of the insulating layers 60 and the electrically conductive layers 30 extends along the first horizontal direction (i.e., the word line direction) hd1. The alternating stacks (30, 60) are laterally spaced from one another along the second horizontal direction hd2 (i.e., the global bit line direction).

The sidewalls of the insulating layers 60 and the electrically conductive layers 30 within each alternating stack (30, 60) can be vertically coincident among one another. As used herein, a first surface and a second surface are vertically coincident with each other if the second surface overlies or underlies the first surface and if there exists a vertical plane including the first surface and the second surface.

Referring to FIGS. 4A and 4B, a sacrificial material is deposited in the trenches 69. The sacrificial material is a material that can be removed selective to the materials of the alternating stacks (30, 60), the insulating cap layers 62, the dielectric pillar spacers 27, and the sacrificial cap structures 314. For example, if the insulating layers 60, the insulating cap layers 62, and the dielectric pillar spacers 27 include silicon oxide, and if the sacrificial cap structures 314 include silicon nitride, the sacrificial material can include a semiconductor material such as amorphous silicon, amorphous carbon, diamond-like carbon, or a silicon-based polymer. In one embodiment, the sacrificial material can include amorphous silicon. Excess portions of the sacrificial material can be removed from above the horizontal plane including the top surfaces of the insulating cap layers 62 by a planarization process, which can employ a recess etch and/or chemical mechanical planarization. Each remaining portion of the sacrificial material in the line trenches 69 constitutes sacrificial rail structures 71.

Referring to FIGS. 5A and 5B, a photoresist layer (not shown) can be applied over the insulating cap layers 62 and the sacrificial rail structures 71, and can be lithographically patterned to form a line and space pattern. Line trenches are formed between patterned portions of the photoresist layer such that the line trenches overlie the areas of the dielectric pillar spacers 27, while the patterned portions of the photoresist layer cover the areas of the semiconductor pillar structures (14B, 14C, 14T). An anisotropic etch process that etches the material of the sacrificial rail structures 71 selective to the material of the insulating cap layer 62 can be performed to remove unmasked portions of the sacrificial rail structures 71.

The pillar cavities 79 are formed in the volumes from which the material of the sacrificial rail structures 71 is removed by the anisotropic etch. Specifically, unmasked portions of the sacrificial rail structures 71 are etched through to form the pillar cavities 79. The pillar cavities 79 can have a respective rectangular horizontal cross-sectional shape. The remaining portions of the sacrificial rail structures 71 constitute sacrificial pillar structures 171, which can be arranged as a two-dimensional array. Each of the sacrificial rail structures 71 is divided into sacrificial pillar structures 171 that are laterally spaced apart along the first horizontal direction hd1 by a respective subset of the pillar cavities 79.

Referring to FIGS. 6A, 6B, and 7A, a dielectric material such as silicon oxide is deposited in the pillar cavities 79. The dielectric material can be deposited by a conformal deposition method or by spin-coating. Excess portions of the dielectric material can be removed from above the horizontal plane including the top surfaces of the insulating cap layers 62 by a planarization process, which can employ a recess etch and/or chemical mechanical planarization. Remaining portions of the dielectric material in the pillar cavities 79 constitute dielectric pillar structures 96, which can be arranged as a two-dimensional periodic array. The two-dimensional array of the sacrificial pillar structures 171 and the two-dimensional array of the dielectric pillar structures 96 can be laterally offset with respect to each other by about one half of the pitch of each two-dimensional array along the first horizontal direction hd1.

Subsequently, the material of the two-dimensional array of the sacrificial pillar structures 171 can be removed selective to the materials of the two-dimensional array of the dielectric pillar structures 96, the insulating cap layers 62, and the alternating stacks (30, 60). For example, if the sacrificial material of the two-dimensional array of the sacrificial pillar structures 171 includes amorphous silicon, a wet etch employing a trimethyl-2 hydroxyethyl ammonium hydroxide (TMY) solution or a KOH solution may be employed to remove the two-dimensional array of the sacrificial pillar structures 171. A two-dimensional array of memory openings 89 can be formed in the volumes from which the sacrificial pillar structures 171 are removed. Each memory opening 89 can have a substantially rectangular horizontal cross-sectional shape. Thus, the two-dimensional array of memory openings 89 can be formed by removing the sacrificial pillar structures 171 selective to the dielectric pillar structures 96.

Subsequently, the sacrificial cap structures 314 can be removed from underneath the memory openings 89, for example, by an isotropic etch or an anisotropic etch. The isotropic or anisotropic etch can recess the sacrificial cap structures 314 at least until the top surfaces of the semiconductor pillars 14 are physically exposed. In an illustrative example, if the sacrificial cap structures 314 include silicon nitride, a wet etch employing hot phosphoric acid can be employed. If the sacrificial cap structures 314 include organosilicate glass, a wet etch employing dilute hydrofluoric acid can be employed. The memory openings 89 can be vertically extended by removing the sacrificial cap structures 314.

Referring to FIG. 7B, surface radicals on the physically exposed surfaces of the exemplary structure are schematically illustrated. The insulating layers 60 and the insulating cap layers 62 can include, and/or consist essentially of, a silicon oxide material such as undoped silicate glass or a doped silicate glass. Upon removal of the sacrificial cap structures 314, physically exposed surfaces of the insulating layers 60 and the insulating cap layers 62 can terminate with hydroxyl radials, i.e., with —OH groups. In contrast, the electrically conductive layers 30 can include, and/or consist essentially of, a conductive metallic nitride material such as TiN, and can terminate with —ON groups.

Referring to FIG. 7C, sidewalls of the insulating layers 60 and the insulating cap layers 62 can be selectively silylated with a chemical including at least one silyl group without silylating sidewalls of the electrically conductive layers 30. Silylation is a process of inducing bonding of a silyl group (—$SiR_3$ wherein each R is an independent radial) on a surface of a material portion. In this case, sidewalls of the electrically conductive layers 30 comprise metallic nitride surfaces having —ON groups, which prevent silylation of the metallic nitride material upon exposure to the chemical. In one embodiment, molecules of the chemical can include a trimethylsilyl group (—$Si(CH_3)_3$) that combines with an oxygen atom of the silicon oxide material of the insulating layers 60 and the insulating cap layer 62. Non-limiting examples of chemicals including the trimethylsilyl group include trimethylsilyl trifluoromethanesulfonate, trimethylsilyl cyanide, trimethylsilyl polyphosphate, tris(trimethylsilyl) phosphite, bis(trimethylsilyl)carbodiimide, trimethylsilyl isocyanate, (trimethylsilyl)phenyl, trifluoromethanesulfonate, and trimethylsilyl acetate. After the selective silylation process, surfaces of the insulating layers 60 and the insulating cap layers 62 can terminate with —O—$SiR_3$ groups such as (—$OSi(CH_3)_3$) groups. The —ON groups on the surfaces of the electrically conductive layers 30 are not affected by the silylation process. The exposed surfaces may optionally be cleaned, such as with a deionized water or other suitable cleaning fluid.

Referring to FIG. 7D, a first silicon-containing barrier material is deposited on surfaces that are not covered by silyl groups, i.e., on surfaces other than the surfaces of the insulating layers 60 and the insulating cap layers 62. As used herein, a "barrier material" is a semiconductor material having a suitable thickness to provide an energy barrier for conduction of electrical current therethrough. A barrier material limits the electrical current therethrough under an electrical bias thereacross.

The first silicon-containing barrier material can be grown from surfaces of the electrically conductive layers 30 without growing the first silicon-containing barrier material from the silylated surfaces of the insulating layers 60 employing a first selective silicon-containing material deposition process. In one embodiment, the first selective silicon-containing material deposition process can include a chemical vapor deposition employing a silicon-containing precursor gas. The first silicon-containing barrier material can grow from the surfaces of the electrically conductive layers 30 and on the surfaces of the top active regions 14T. Silicon-containing barrier material portions 182 can grow from the surfaces of the electrically conductive layers 30, and silicon-containing material plates 282 can grow from the top surfaces of the top active regions 14T. A low pressure chemical vapor deposition (LPCVD) process can be employed to selectively deposit the first silicon-containing barrier material. Non-limiting exemplary silicon-containing reactants that can be employed in the deposition process include silane, disilane, dichlorosilane, and trichlorosilane.

The silylation process causes silicon oxide surfaces to be covered with silyl groups (such as trimethylsilyl groups) having a high molecular weight. The steric hindrance caused by the silyl groups prevents physically adsorbed reactants from transitioning into a chemically adsorbed state or into decomposition into a silicon-containing material. Thus, incubation time for nucleation of the first silicon-containing barrier material is extended on surfaces with the silyl groups. The non-silylated surfaces of the electrically conductive layers 30 does not prevent nucleation or decomposition of the silicon-containing reactant. Thus, the preceding silylation process differentiates the incubation characteristics of surfaces between the sidewalls of the insulating layers 60 and the sidewalls of the electrically conductive layers 30, and results in selective deposition of the first silicon-containing barrier material only from the surfaces of the electrically conductive layers 30 while growth of the first silicon-containing barrier material from the insulating layers 60 is suppressed. The difference in the incubation time between silylated surfaces and non-silylated surfaces can be in a range from 10 seconds to 10 minutes, although lesser and greater differences can be provided depending on the process conditions of the deposition process. In one embodiment, by terminating the deposition process before deposition on the insulating layers 60 commences, deposition of the first silicon-containing barrier material on the surfaces of the insulating layers 60 can be prevented or minimized.

In one embodiment, the first silicon-containing barrier material can include an amorphous silicon-containing semiconductor material, and can consist of doped or undoped amorphous silicon. In one embodiment, the first silicon-containing barrier material can consist essentially of amorphous silicon. In another embodiment, the first silicon-containing barrier material can consist essentially of p-doped amorphous silicon or n-doped amorphous silicon. Two vertical stacks of silicon-containing barrier material portions 182 can be formed within each memory opening 89. The lateral thickness of each silicon-containing barrier material portions 182 can be in a range from 1.5 nm to 6 nm, although lesser and greater thicknesses can also be employed. Subsequently, a clean process, such as a SPM (i.e., $H_2SO_4+H_2O_2$) or $O_3$ water clean process, may be performed to remove remaining silyl groups from the surfaces of the insulating layers 60 and the insulating cap layers 62.

Referring to FIG. 7E, a memory material layer 184 can be formed on the silicon-containing barrier material portions 182 and the sidewalls of the insulating layers 60 and the insulating cap layers 62. In one embodiment, the memory material layer 184 can include a metal oxide material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0\times10^{20}/cm^3$ to $1.0\times10^{21}/cm^3$.

In a non-limiting illustrative example, the memory material layer 184 comprises a continuous crystalline titanium oxide layer that extend from a bottommost one of the electrically conductive layers 30 to a topmost one of the electrically conductive layers 30 around each memory opening 89. In one embodiment, the memory material layer 184 has a composition of $TiO_x$, in which x is in a range from 1.5 to 2.0 (such as from 1.8 to 2.0). The thickness of the memory material layer 184 can be in a range from 1.5 nm to 10 nm, such as from 2 nm to 6 nm, although lesser and greater thicknesses can also be employed.

A conductive metallic nitride layer 192 can be deposited on the memory material layer 184. The conductive metallic nitride layer 192 can include a conductive metal nitride such as TiN, TaN, or WN. The conductive metallic nitride layer 192 can be deposited by a conformal or non-conformal deposition process. The thickness of vertical portions of the conductive metallic nitride layer 192 can be in a range from 2 nm to 10 nm, although lesser and greater thicknesses can also be employed.

Referring to FIG. 7F, an anisotropic etch process can be performed to remove horizontal portions of the conductive metallic nitride layer 192 and the memory material layer 184 and inner portions of the silicon-containing material plates 282. A top surface of a top active region 14T can be physically exposed underneath each memory opening 89. Each silicon-containing material plate 282 can have an annular shape after the anisotropic etch process.

Referring to FIGS. 7G and 7H, a conductive material can be deposited in remaining volumes of the memory openings 89. Excess portions of the conductive material can be removed from above the horizontal plane including the top surfaces of the insulating cap layers 62 by a planarization process. The planarization process can employ chemical mechanical planarization (CMP) and/or a recess etch process. A conductive fill material portion 194 is formed within each remaining volume of the memory openings 89. Each contiguous combination of a conductive metallic nitride layer 192 and a conductive fill material portion 194 constitutes a vertical conductive line (192, 194) that is electrically shorted to an underlying top active region 14T of a vertical field effect transistor. The vertical conductive lines (192, 194) can function as a two-dimensional array of vertically-extending bit lines for memory elements of each memory cell, which are portions of the memory material layer 184 that are located at each intersecting region between the vertical conductive lines (192, 194) (e.g., local bit lines) and the electrically conductive layers 30 (e.g., word lines).

While the present disclosure is described employing a configuration in which a vertical field effect transistor is provided below each vertical conductive line (192, 194), a field effect transistor may be provided under, or over, each vertical conductive line (192, 194) provided that the field effect transistor can activate and deactivate the vertical conductive line (192, 194). An active region of the field effect transistor is electrically shorted to a top end or a bottom end of the vertical conductive line (192, 194).

As shown in FIG. 7H, within each memory openings 89, a memory material layer 184 can be formed on sidewalls of a neighboring pair of dielectric pillar structures 96 located adjacent to the respective memory openings 89. A first portion 1841 of the memory material layer 184 that contacts an alternating stack of insulating layers 60 and electrically conductive layers 30 with protruding barrier material portions 182 has a laterally undulating vertical cross-sectional profile, i.e., a sidewall having a lateral position that modulates with a vertical distance from a horizontal plane including the bottommost surface of the alternating stack (30, 60). The first portion 1841 of the memory material layer 184 shifts outward to contact each of the insulating layers 60 and shifts inward to contact each of the protruding barrier material portions 182. Second portions 1842 of the memory material layer 184 that contact the neighboring pair of dielectric pillar structures 96 include a respective pair of straight vertical sidewalls that does not have any lateral modulation in a vertical cross-sectional profile.

According to an aspect of the present disclosure, a resistive memory device includes an alternating stack of insulating layers 60 and electrically conductive layers 30 that extend along a first horizontal direction hd1, wherein sidewalls of the electrically conductive layers 30 are vertically coincident with sidewalls of the insulating layers 60. Discrete silicon-containing barrier material portions 182 are located on a respective one of the sidewalls of the electrically conductive layers 30 and vertically spaced among one another. A memory material layer 184 contacts the silicon-containing barrier material portions 182 and the sidewalls of the insulating layers 60. A vertical conductive line (192, 194) contacts the memory material layer 184.

Each of the silicon-containing barrier material portions 182 includes a planar outer vertical sidewall (i.e., a vertical sidewall within a two-dimensional vertical plane) that contacts the respective one of the sidewalls of the electrically conductive layers 30 and further includes a contoured inner sidewall that contacts the memory material layer 184. Each of the contoured inner sidewalls includes an upper convex surface portion that laterally extends along the first horizontal direction hd1 and adjoined to a respective one of the insulating layers 60, a lower convex surface portion that laterally extend along the first horizontal direction hd1 and adjoined to a respective another one of the insulating layers 60, and a vertical surface portion that connects the upper convex surface portion and the lower convex surface portion.

A plurality of alternating stacks of insulating layers 60 and electrically conductive layers 30 can be provided such that each layer within the alternating stacks (30, 60) has a strip shape that laterally extends along the first horizontal direction hd1 with a uniform width. Thus, in addition to the alternating stack (30, 60) including insulating layers 60 and electrically conductive layers 30, the resistive memory device includes an additional alternating stack of additional insulating layers 60 and additional electrically conductive layers 30 that extend along the first horizontal direction hd1 and laterally spaced from the alternating stack (30, 60) along a second horizontal direction hd2 that is perpendicular to the first horizontal direction hd1. The silicon-containing barrier material portions 182, the memory material layer 184, and the vertical conductive line (192, 194) are located between the alternating stack (30, 60) and the additional alternating stack (30, 60).

A row of dielectric pillar structures 96 can be provided between two alternating stacks (30, 60) of insulating layers 60 and electrically conductive layers 30. Each dielectric pillar structure 96 can have a respective rectangular horizontal cross-sectional shape, can be arranged along the first horizontal direction, and can contact portions of the sidewalls of the electrically conductive layers 30 and the insulating layers 60 within each of the two alternating stacks (30, 60). The silicon-containing barrier material portions 182, the memory material layer 184, and the vertical conductive line (192, 194) are located between a neighboring pair of dielectric pillar structures 96 among the row of dielectric pillar structures 96.

In one embodiment shown in FIG. 7H, each of the silicon-containing barrier material portions 182 has a pair of vertical sidewalls that contacts sidewalls 961 of the neighboring pair of dielectric pillar structures 96 that extend along the second horizontal direction hd2. In one embodiment, the memory material layer 184 can have a rectangular tubular shape, and can contact sidewalls 961 of the neighboring pair of dielectric pillar structures 96.

In one embodiment, first portions 1841 of the memory material layer 184 that contact the alternating stack (30, 60) or the additional alternating stack (30, 60) have a laterally undulating vertical cross-sectional profile, and second portions 1842 of the memory material layer 184 that contact the neighboring pair of dielectric pillar structures 96 include a respective pair of straight vertical sidewalls that contact the sidewalls 961 of the dielectric pillar structures 96 that laterally extend along the second horizontal direction hd2.

In one embodiment, the silicon-containing barrier material portions 182 comprise a doped or undoped amorphous silicon, the insulating layers 60 comprise silicon oxide, and the electrically conductive layers 30 comprise titanium nitride. In one embodiment, the memory material layer 184 comprises a continuous crystalline, oxygen deficient titanium oxide layer to form a barrier modulated cell (BMC) type ReRAM device. Layer 184 extends from a bottommost one of the electrically conductive layers 30 to a topmost one of the electrically conductive layers 30. The vertical conductive line (192, 194) comprises a conductive metallic nitride layer 192 that contacts the memory material layer 184 and having a laterally undulating vertical cross-sectional profile.

A vertical field effect transistor can underlie or overlie the vertical conductive line (192, 194). An active region (such as a top active region 14T) of the vertical field effect transistor is electrically shorted to a top end or a bottom end of the vertical conductive line (192, 194).

As shown in FIG. 8, word line select transistors (T1-T4) for selectively activating a respective electrically conductive layer 30 (which functions as a word line) can be formed at any suitable stage of the processing sequence. For example, the word line select transistors can be formed in, or on, the substrate 8 if the substrate 8 includes a semiconductor substrate. Alternatively or additionally, the word line select transistors can be formed prior to, concurrently with, or after formation of the vertical field effect transistors (14, 16, 18). Alternatively or additionally, the word line select transistors can be formed prior to, or after, formation of the vertical conductive lines 90. Any method for forming transistors as known in the art can be employed to provide the second select transistors. A switched node (e.g., a source region or a drain region) of each second select transistor can be connected to an end of a respective electrically conductive layer 30, and another node (e.g., a drain region or a source region) can be connected to a voltage source (or current source) which provides a node activation voltage V_a.

In one embodiment, each global bit line 10 laterally extends along the second horizontal direction hd2, and two or more of the vertical field effect transistors (14, 16, 18) can be electrically connected to the global bit line 10. The vertical field effect transistors (14, 16, 18) are configured to activate a selected vertical conductive line 90 by supplying an activation voltage thereto from a respective global bit line 10, and the word line select transistors (T1-T4) are configured to activate a selected electrically conductive layer 30 by supplying another activation voltage thereto. In one embodiment, the exemplary structure can include a monolithic three-dimensional memory device comprises a resistive random access memory (ReRAM) device.

FIGS. 9A and 9B illustrate an exemplary resistive memory cell 180 which comprises a non-filamentary barrier modulated cell (BMC), which can be employed as the resistive memory cells 180 in the exemplary structures of the present disclosure as described above. In one embodiment, each resistive memory cell 180 can include a portion of a memory material layer 184 including a metal oxide material, such as $TiO_{2-\delta}$ having at least two resistive states having different resistivity. The memory cell also includes a silicon-containing barrier material portions 182 including amorphous silicon or a silicon-containing barrier material. An interfacial barrier oxide 186 is located between the memory material layer 184 and a barrier material portion 182. The interfacial barrier oxide 186 may comprise interfacial silicon oxide.

Without wishing to be bound by a particular theory, it is believed that the BMC ReRAM device operates based on the principle shown in FIGS. 9A and 9B. FIG. 9A illustrates the BMC ReRAM device in the reset state. The switching mechanism in BMC stack is generally understood as oxygen interstitial (Oi) generation in the interfacial barrier oxide (e.g., $SiO_2$) 186 after a RESET operation (i.e., resetting the stack into the high resistivity state, HRS). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface). This re-oxidation decreases the conductivity of the $TiO_{2-\delta}$ material and/or increases the thickness of the insulating interfacial barrier oxide 186 and hence increases the resistance of the BMC memory cell.

FIG. 9B illustrates the BMC ReRAM device in the set state. During the SET operation, opposite voltage is applied across the cell, and Ti—O bonds are supposed to be broken down to generate Oi and Vo (oxygen vacancy) pair in the memory material layer 184. Oi may drift back to the interface between the memory material layer 184 and the barrier material portion 182 along the electric field to increase the conductivity of the $TiO_{2-\delta}$ layer and/or decrease the thickness of the insulating interfacial barrier oxide 186 and hence decrease the resistance of the BMC memory cell to set the memory cell into the low resistivity state, LRS.

Without wishing to be bound by a particular theory, it is believed that a BMC ReRAM device of the embodiments of the present disclosure may operate based on the principle described above with respect to FIGS. 9A and 9B and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide 186.

Figure 10A:
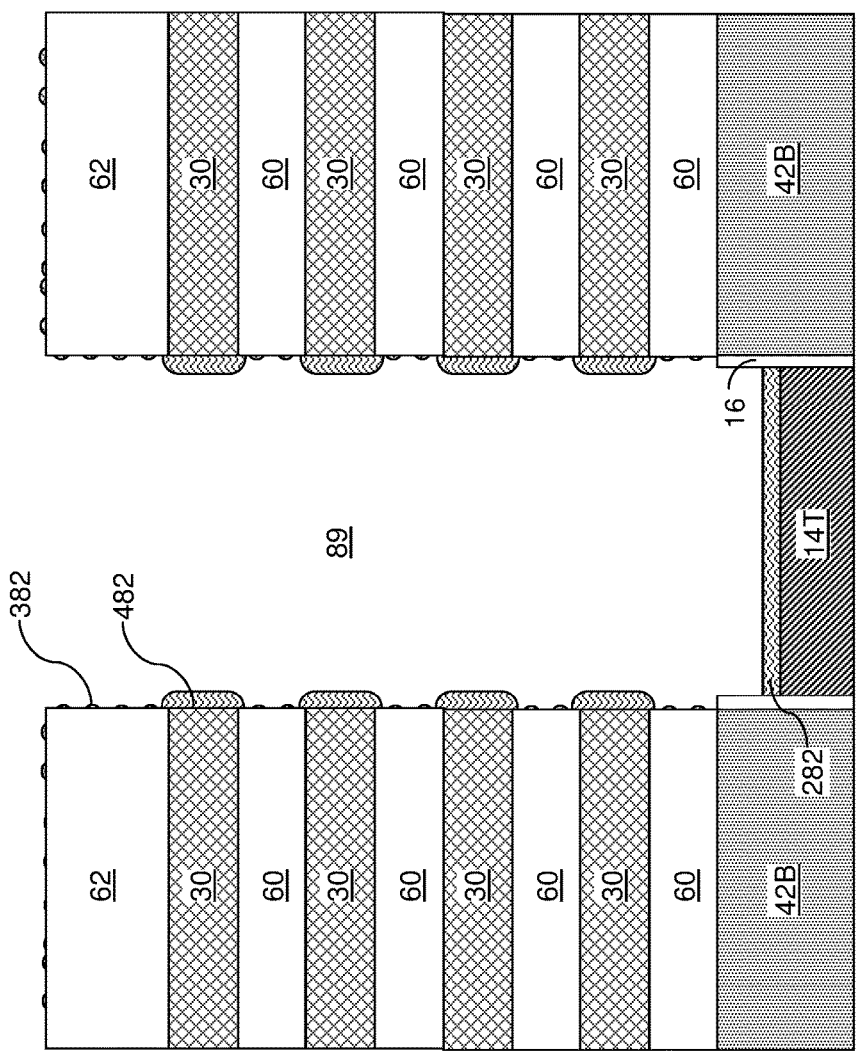

FIGS. 10A-10D are sequential vertical cross-sectional views of a memory opening 89 of the exemplary structure in an alternative embodiment in which optional additional processing steps are employed. The additional processing steps can be performed after the processing steps of FIG. 7D and prior to the processing steps of FIG. 7E. In this case, the structure illustrated in FIG. 10A is formed in lieu of the structure of FIG. 7D.

Referring to FIG. 10A, a region around a memory opening 89 is illustrated for an embodiment in which silicon-containing nucleation regions 382 are formed in addition to first silicon-containing barrier material portions 482 during deposition of the first silicon-containing barrier material. In this case, the deposition process that deposits the first silicon-containing barrier material can proceed until the incubation time on the insulating layers 60 elapses, and nucleation of the first silicon-containing barrier material commences on the surfaces of the insulating layers 60 and the insulating cap layers 62 to form the silicon-containing nucleation regions 382. The portions of the first silicon-containing barrier material that are deposited on the electrically conductive layers 30 constitute the first silicon-containing barrier material portions 482. In one embodiment, the silicon-containing nucleation regions 382 and the first silicon-containing barrier material portions 482 include amorphous silicon.

Figure 10B:
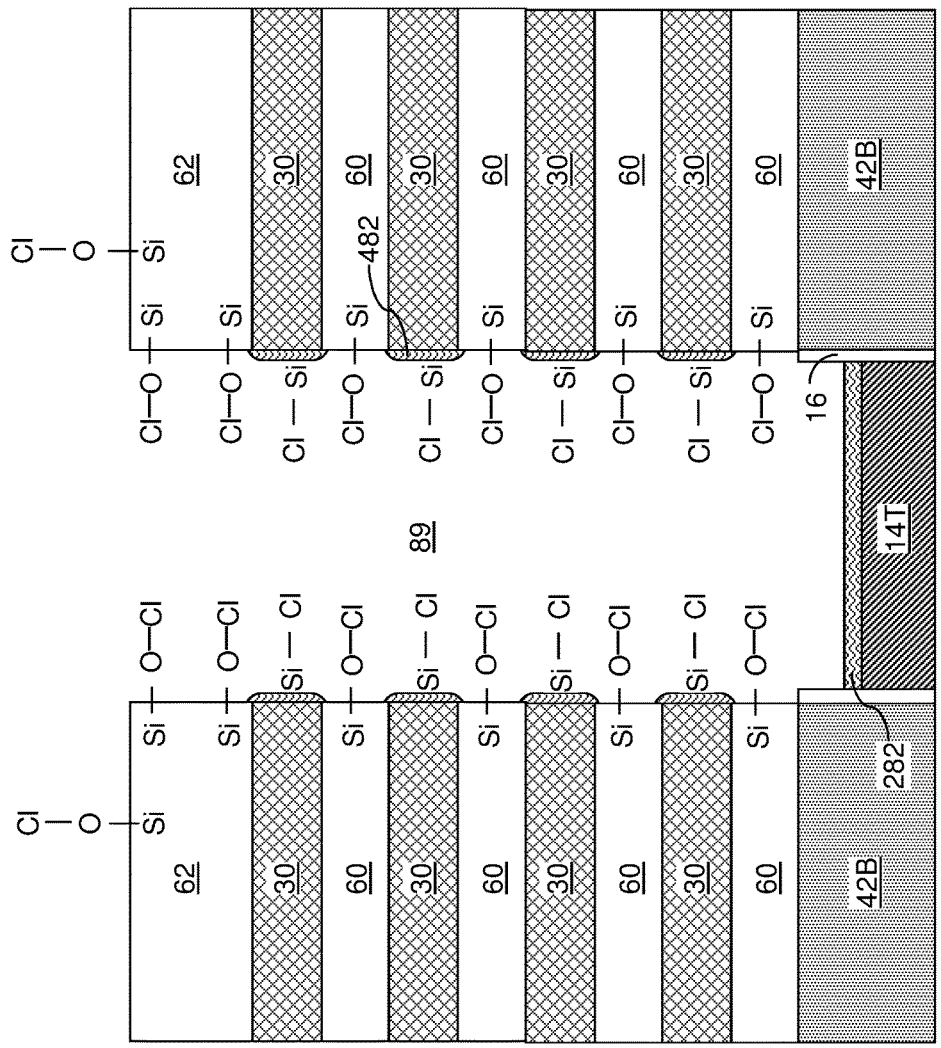

Referring to FIG. 10B, an isotropic etch process employing a halogen-containing etchant can be performed to etch back the first silicon-containing barrier material partially. The halogen-containing etchant can be a halogen-containing gas, which can include a halogen gas such as $Cl_2$ or a hydrogen halide such as HBr. The isotropic etch process can be a gas phase etch process, and the duration of the isotropic etch process can be selected such that the silicon-containing nucleation regions 382 are completely removed while the first silicon-containing barrier material portions 482 are only partially removed by the etching. Thus, the first silicon-containing barrier material portions 482 are thinned by the isotropic etch process. In one embodiment, all sidewall surfaces of the electrically conductive layers 30 that face the memory opening 89 can be covered by the first silicon-containing barrier material portions 482 after thinning. The thickness of the first silicon-containing barrier material portions 482 after thinning can be in a range from 0.7 nm to 4 nm, such as from 1 nm to 3 nm, although lesser and greater thicknesses can also be employed.

Halogen atoms in the halogen-containing etchant replace hydrogen atoms on the surfaces of the insulating layers 60 and the first silicon-containing barrier material portions 482. Thus, a chlorine radical (—Cl) can be attached to silicon atoms located on physically exposed surfaces of the first silicon-containing barrier material portions 482, and an —OCl radial can be attached to silicon atoms located on physically exposed surfaces of the insulating layers 60 and the insulating cap layers 62 after the isotropic etch process. In other words, surfaces of the first silicon-containing barrier material portions 482 and the sidewalls of the insulating layers 60 can be halogenated by treatment with the halogen-containing gas that is employed during the isotropic etch process.

Figure 10C:
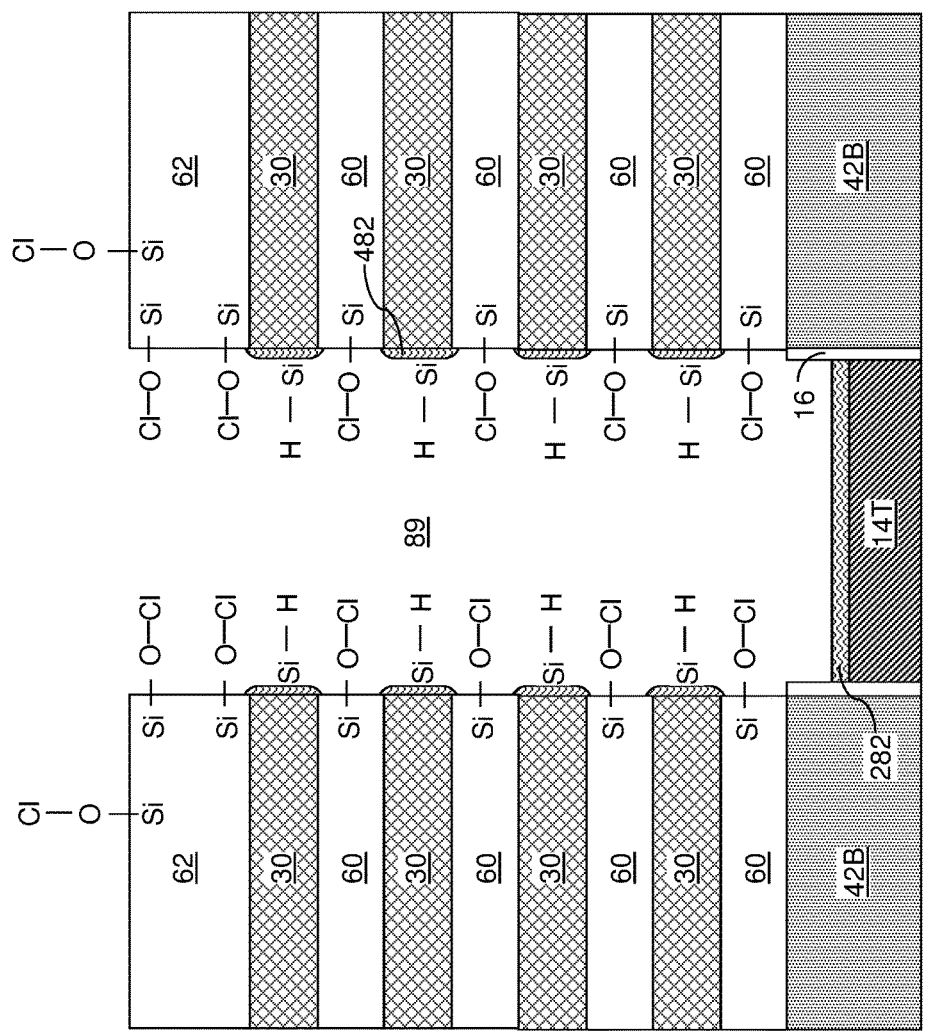

Referring to FIG. 10C, surfaces of the first silicon-containing barrier material portions 482 can be selectively hydrogenated while the sidewalls of the insulating layers 60 remain halogenated. The selective hydrogenation of the surfaces of the first silicon-containing barrier material portions 482 can be performed by treatment with a hydrogen-containing gas such as aminosilane ($H_2NSiH_3$) gas. In this case, the aminosilane gas can replace the halogen atoms (such as chlorine atoms or bromine atoms) attached to the silicon atoms on the surfaces of the first silicon-containing barrier material portions 482. However, the halogen atoms attached to the silicon atoms of the silicon oxide material within the insulating layers 60 and the insulating cap layers 62 through oxygen atoms are not replaced with hydrogen atoms because of the strong bond between the halogen atoms and the oxygen atoms. Thus, replacement of the halogen atoms with hydrogen atoms proceeds selectively only on the surfaces of the first silicon-containing barrier material portions 482, and does not proceed on the surfaces of the insulating layers 60 and the insulating cap layers 62. Thus, the exemplary structure of FIG. 10C has hydrogen-termination on the surfaces of the first silicon-containing barrier material portions 482, and has halogen-termination on the sidewalls of the insulating layers 60 and the insulating cap layers 62.

Figure 10D:
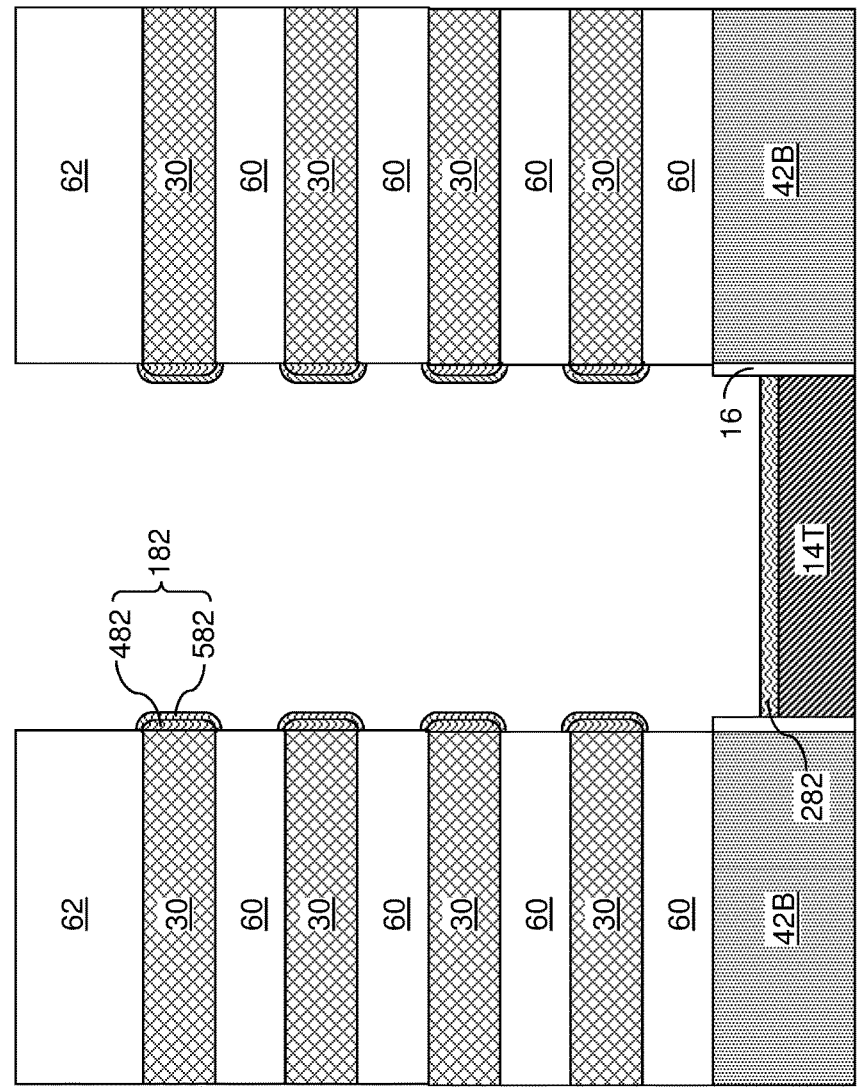

Referring to FIG. 10D, a second silicon-containing barrier material is selectively grown from surfaces of the first silicon-containing barrier material portions 482 while growth of the second silicon-containing barrier material from the surfaces of the insulating layers 60 and the insulating cap layers 60 is suppressed. The —OCl group attached to the surfaces of the insulating layers 60 and the insulating cap layers 62 prevents or reduces nucleation of the second silicon-containing barrier material. The second silicon-containing barrier material can be, for example, amorphous silicon.

Applicants demonstrated that the incubation time for nucleation of the second silicon-containing barrier material on silicon oxide insulating layers 60 and insulating cap layer 62 can be greater than 60 minutes in the course of the research leading to the present disclosure. In a first test, hydrogen-terminated silicon surfaces and —OH terminated silicon oxide surfaces were subjected to a low temperature silicon deposition process at the temperature of 325 degrees Celsius. About 35 nm of amorphous silicon growth was observed on the hydrogen-terminated silicon surfaces, and about 18 nm of amorphous silicon growth was observed on the —OH terminated silicon oxide surfaces after 60 minutes of exposure to a reactant gas (disilane). In a second test, chlorine-terminated silicon surfaces and —OCl terminated silicon oxide surfaces were subjected to a low temperature silicon deposition process at the temperature of 325 degrees Celsius. No growth was observed on the chlorine-terminated silicon surfaces and the —OCl terminated silicon oxide surfaces after 60 minutes of exposure to the reactant. In a third test, hydrogen-terminated silicon surfaces and —OCl terminated silicon oxide surfaces were subjected to a low temperature silicon deposition process at the temperature of 325 degrees Celsius. About 35 nm of amorphous silicon growth was observed on the hydrogen-terminated silicon surfaces, while no silicon deposition was observed on the —OCl terminated silicon oxide surfaces after 60 minutes of exposure to the reactant. Thus, selective deposition of the second silicon-containing barrier material can proceed only on the first silicon-containing barrier material portions 482.

The deposited second silicon-containing barrier material forms second silicon-containing barrier material portions 582. Each contiguous pair of a first silicon-containing barrier material portion 482 and a second silicon-containing barrier material portion 582 constitutes a silicon-containing barrier material portion 182 illustrated in FIG. 7D.

In one embodiment, the second silicon-containing barrier material portion 582 can have the same composition as the first silicon-containing barrier material portion 482 within each silicon-containing barrier material portion 182. For example, the silicon-containing barrier material portions 182 can consist essentially of amorphous silicon. In another embodiment, the second silicon-containing barrier material portion 582 and the first silicon-containing barrier material portion 482 within each silicon-containing barrier material portion 182 can have different compositions. For example, the second silicon-containing barrier material portion 582 and the first silicon-containing barrier material portion 482 can be doped with different species, or different concentrations, of germanium, p-type dopants, or n-type dopants. In one embodiment, the silicon-containing barrier material portions 182 can include a diode containing a p-n junction at an interface between the second silicon-containing barrier material portion 582 and the first silicon-containing barrier material portion 482 therein.

The resistive memory device of the present disclosure includes the silicon-containing barrier material portions 182 as discrete structures that are vertically spaced apart at each level of the insulating layers 60. In other words, the silicon-containing barrier material portions 182 are not portions of a continuous barrier material layer, but are formed as discrete components that do not directly contact each other. Thus, a leakage current path between neighboring pairs of silicon-containing barrier material portions 182 is reduced or eliminated. Thus, a resistive random access memory device of the present disclosure provides reduced leakage across neighboring pairs of word lines (i.e., neighboring pairs of electrically conductive layers 30).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a resistive memory device, comprising:
    forming an alternating stack of insulating layers and electrically conductive layers that extend along a first horizontal direction over a substrate, wherein the insulating layers comprise a silicon oxide material;
    selectively silylating sidewalls of the insulating layers with a chemical including at least one silyl group without silylating sidewalls of the electrically conductive layers;
    forming silicon-containing barrier material portions at least by selectively growing a first silicon-containing barrier material from surfaces of the electrically conductive layers without growing the first silicon-containing barrier material from silylated surfaces of the insulating layers;
    forming a memory material layer on the silicon-containing barrier material portions and the sidewalls of the insulating layers; and
    forming a vertical conductive line on the memory material layer.

2. The method of claim 1, wherein sidewalls of the electrically conductive layers comprise metallic nitride surfaces having —ON groups that prevent silylation of the metallic nitride material upon exposure to the chemical.

3. The method of claim 1, wherein:

the chemical is selected from trimethylsilyl trifluoromethanesulfonate, trimethylsilyl cyanide, trimethylsilyl polyphosphate, tris(trimethylsilyl) phosphite, bis(trimethylsilyl)carbodiimide, trimethylsilyl isocyanate, (trimethylsilyl)phenyl, trifluoromethanesulfonate, and trimethylsilyl acetate; and molecules of the chemical comprise a trimethylsilyl group (—Si(CH$_3$)$_3$) that combines with an oxygen atom of the silicon oxide material.

4. The method of claim 1, further comprising:

providing hydrogen-termination on portions of the first silicon-containing barrier material formed by the first selective silicon-containing material deposition process and providing halogen-termination on the sidewalls of the insulating layers; and growing a second silicon-containing barrier material from surfaces of the first silicon-containing barrier material while suppressing growth of the second silicon-containing barrier material from the sidewalls of the insulating layers, wherein each of the silicon-containing barrier material portions includes a respective portion of the first silicon-containing barrier material and a respective portion of the second silicon-containing barrier material.

5. The method of claim 4, further comprising:

halogenating surfaces of the portions of the first silicon-containing barrier material and the sidewalls of the insulating layers by treatment with a halogen-containing gas; and selectively hydrogenating the surfaces of the portions of the first silicon-containing barrier material while the sidewalls of the insulating layers remain halogenated by treatment with a hydrogen-containing gas, to provide the hydrogen-termination on the portions of the first silicon-containing barrier material and the halogen-termination on the sidewalls of the electrically conductive layers.

6. The method of claim 5, wherein:

the halogen-containing gas is selected from Cl$_2$ and HBr; and the hydrogen-containing gas comprises aminosilane (H$_2$NSiH$_3$) gas.

7. The method of claim 1, further comprising:

forming a continuous alternating stack of continuous insulating layers and continuous electrically conductive layers over the substrate; and patterning the continuous alternating stack into a plurality of staked structures including the alternating stack and additional alternating stacks that are laterally spaced apart among one another by line trenches that extend along the first horizontal direction.

8. The method of claim 7, further comprising:

forming sacrificial rail structures in the line trenches;

forming pillar cavities by etching through portions of the sacrificial rail structures, whereby each of the sacrificial rail structures is divided into sacrificial pillar structures that are laterally spaced apart along the first horizontal direction by a respective subset of the pillar cavities;

forming dielectric pillar structures in the pillar cavities; and forming memory openings by removing the sacrificial pillar structures selective to the dielectric pillar structures, wherein the silicon-containing barrier material portions are formed in one of the memory openings.

9. The method of claim 8, wherein:

the memory material layer is formed within the one of the memory openings and on sidewalls of a neighboring pair of dielectric pillar structures located adjacent to the one of the memory openings;

a first portion of the memory material layer that contacts the alternating stack has a laterally undulating vertical cross-sectional profile; and second portions of the memory material layer that contact the neighboring pair of dielectric pillar structures and including a respective pair of straight vertical sidewalls.

10. The method of claim 1, wherein:

the silicon-containing barrier material portions comprise a doped or undoped amorphous silicon;

the electrically conductive layers comprise titanium nitride; and the memory material layer comprises a continuous oxygen deficient crystalline titanium oxide layer to form a barrier modulated cell (BMC) resistive memory device.

\* \* \* \* \*